United States Patent
Ikedo

(10) Patent No.: US 8,514,969 B2
(45) Date of Patent: Aug. 20, 2013

(54) AMPLITUDE CONTROL CIRCUIT, POLAR MODULATION TRANSMISSION CIRCUIT, AND POLAR MODULATION METHOD

(75) Inventor: Taichi Ikedo, Kanagawa (JP)

(73) Assignee: Panasonic Corporation, Osaka (JP)

( * ) Notice: Subject to any disclaimer, the term of this patent is extended or adjusted under 35 U.S.C. 154(b) by 129 days.

(21) Appl. No.: 13/376,971

(22) PCT Filed: Jun. 7, 2010

(86) PCT No.: PCT/JP2010/003784
§ 371 (c)(1),
(2), (4) Date: Dec. 8, 2011

(87) PCT Pub. No.: WO2010/143406
PCT Pub. Date: Dec. 16, 2010

(65) Prior Publication Data
US 2012/0082265 A1 Apr. 5, 2012

(30) Foreign Application Priority Data

Jun. 11, 2009 (JP) ................. 2009-140546

(51) Int. Cl.
*H04L 27/00* (2006.01)
(52) U.S. Cl.
USPC .......... 375/295; 375/297; 375/300; 332/155; 455/91; 455/114.3; 455/115.1
(58) Field of Classification Search
USPC .............. 375/268, 261, 295, 297, 298, 300; 332/149, 155, 159, 162, 103; 455/13.4, 91, 455/108, 114.3, 115.1, 115.3, 127.1, 127.2
See application file for complete search history.

(56) References Cited

U.S. PATENT DOCUMENTS

| | | | |
|---|---|---|---|
| 7,593,698 B1 * | 9/2009 | Johnson et al. ............. | 455/102 |
| 8,155,604 B2 * | 4/2012 | Rofougaran ................ | 455/102 |
| 8,243,854 B2 * | 8/2012 | Ikedo ........................... | 375/300 |
| 8,457,567 B2 * | 6/2013 | Ryter ............................ | 455/108 |
| 2006/0009169 A1 | 1/2006 | Arayashiki | |
| 2007/0021081 A1 | 1/2007 | Passoke | |
| 2007/0297530 A1 | 12/2007 | Maeda et al. | |

FOREIGN PATENT DOCUMENTS

| | | |
|---|---|---|
| JP | 2004-266351 A | 9/2004 |
| JP | 2007-243510 A | 9/2007 |
| WO | 2007/148753 A1 | 12/2007 |

OTHER PUBLICATIONS

International Search Report for PCT/JP2010/003784 dated Jul. 20, 2010.

* cited by examiner

*Primary Examiner* — Dac Ha
(74) *Attorney, Agent, or Firm* — Pearne & Gordon LLP

(57) ABSTRACT

A reference voltage adjustment unit (212) calculates gain from a DA converter (121) to an offset calculating unit (123) by detecting the output of the offset calculating unit (123), adjusts the reference voltage (V3) from a reference voltage generation unit (211) so that the value becomes a predetermined value, and feeds the post-adjustment reference voltage (V4) to the DA converter (121) and offset calculating unit (123). Due to this, the gain from the DA converter (121) to the offset calculating unit (123) can be corrected. Fluctuation in the lower limit level of the output of a differential-to-single conversion unit (124) can be minimized as a result, so, the addition of unnecessary offset to the amplitude data at the amplifier unit (140) can be minimized. Thus, deterioration in modulation characteristics when the amplitude control unit (210) takes a differential circuit configuration can be minimized.

13 Claims, 16 Drawing Sheets

AMPLITUDE CONTROL CIRCUIT, POLAR MODULATION TRANSMISSION CIRCUIT, AND POLAR MODULATION METHOD

TECHNICAL FIELD

The present invention relates to an amplitude control circuit, polar modulation transmission circuit, and polar modulation method used for a communication device including, for example, a mobile telephone and a wireless LAN. More specifically, the present invention relates to an amplitude control circuit, polar modulation transmission circuit, and polar modulation method that operate with high efficiency and low distortion.

BACKGROUND ART

A communication device such as a mobile telephone and a wireless LAN is required to maintain linearity of a transmission signal over a wide range of output level and operate at low power consumption at the same time. In this communication device, a transmission circuit that operates with high efficiency and low distortion is used. A conventional transmission circuit will be described below.

As a conventional transmission circuit, for example, there is a transmission circuit (hereinafter referred to as "quadrature modulation circuit") that generates a transmission signal by using a modulation scheme such as quadrature modulation. Since a quadrature modulation circuit is widely known, the explanation will be omitted. As a conventional transmission circuit that outputs a transmission signal that has high linearity more efficiently than a quadrature modulation circuit, for example, there is a transmission circuit disclosed in patent literature 1. FIG. 1 is a block diagram showing an example of a configuration of conventional transmission circuit 10 disclosed in patent literature 1. In FIG. 1, conventional transmission circuit 10 has amplitude phase extraction section 11, amplitude control section 12, phase modulation section 13, amplification section 14, and output terminal 15.

Amplitude phase extraction section 11 extracts amplitude data and phase data from input data. Amplitude data is input to amplitude control section 12. Amplitude control section 12 supplies voltage to match amplitude data to amplification section 14. Also, phase data is input to phase modulation section 13. Phase modulation section 13 performs phase modulation using the input phase data, and outputs a phase modulation signal. Phase modulation section 13 has to be formed by, for example, a frequency synthesizer. A phase modulation signal is input to amplification section 14. Amplification section 14 amplifies a phase modulation signal depending on voltage supplied from amplitude control section 12. A signal amplified at amplification section 14 is output from output terminal 15 as a transmission signal. The output level of the transmission signal changes output voltage of amplitude control section 12 and can be controlled by being supplied to amplification section 14. In this way, the method of separating amplitude data and phase data from input data and modulating by using these pieces of data is referred to as a polar modulation scheme or a polar coordinate modulation scheme. Also, transmission circuit 10 that performs this method is referred to as a polar modulation circuit (hereinafter also referred to as "polar coordinate modulation circuit").

CITATION LIST

Patent Literature

PTL1
Japanese Patent Application Laid-Open No.2004-266351 (FIG. 9)

SUMMARY OF INVENTION

Technical Problem

However, with conventional transmission circuit 10, there is a problem that it is difficult to suppress output noise of amplitude control section 12. The reasons will be described below. FIG. 2 shows a specific configuration of amplitude control section 12. In FIG. 2, DA converter 12-1 converts amplitude data, that is a digital signal, to an analogue signal. Level control section 12-2 changes output level of DA converter 12-1, according to transmitting power information P (that is often represented with a digital signal) that shows the size of average output power of transmission circuit 10. Buffer 12-3 amplifies the output of level control section 12-2 and outputs the result to amplification section 14. By configuring as above, transmission circuit 10 changes the output voltage (that is, the power supply voltage of amplification section 14) of amplitude control section 12, and makes it possible to control output level of a transmission signal output from amplification section 14.

Here, since amplification section 14 generally uses a high power amplifier, called a power amplifier, buffer 12-3 of amplitude control section 12 that drives amplification section 14, is required to supply large current. Meanwhile, DA converter 12-1 of amplitude control section 12 requires a high speed clock in order to perform DA conversion to amplitude data that has a much broader band than IQ data used at, for example, quadrature modulation.

Thus, if making amplitude control section 12 an IC chip, a low voltage process to enable high speed operation is used for DA converter 12-1 where high speed operation is required, and level control section 12-2 that is controlled by a digital signal; and a high voltage process that can handle large current is often used for buffer 12-3:

However, in general, unlike in the process that can handle large current, in the process that enables high speed operation, voltage tends to be lower, so that it is difficult to increase output amplitude, that is, to hold a wide dynamic range. For this reason, buffer 12-3 is required to increase gain, so that there has been a problem that, the output noise from level control section 12-2 is amplified by buffer 12-3, and results in the increase of the output noise of amplitude control section 12. Since the output noise of amplitude control section 12 is output to amplification section 14, especially the output of the noise in a receiving band leads to lowering of receiving sensitivity and becomes a serious problem.

The present invention provides an amplitude control circuit, polar modulation transmission circuit, and polar modulation method that can decrease output noise and suppress degradation of receiving sensitivity.

Solution to Problem

One aspect of the amplitude control circuit of the present invention is the amplitude control circuit that is used for a polar modulation transmission circuit, the amplitude control circuit employs a configuration having: a DA converter that converts amplitude data into a differential amplitude signal and outputs the result; a level control section that controls level of the differential amplitude signal output from the DA converter, according to transmitting power information that shows output power of the polar modulation transmission circuit; a first offset calculation section that applies a DC offset to match the transmitting power information to the differential amplitude signal output from the level control section; a differential single conversion section that performs differential single conversion to a differential amplitude signal output from the first offset calculation section and outputs the result; a reference voltage generation section that supplies a reference voltage to the differential single conversion section; and a reference voltage adjusting section that calculates gain from the DA converter to the first offset calculation section, by detecting output of the first offset calculation section, adjusts the reference voltage from the reference voltage generation section in order to make the value of the gain to be the defined value, and supplies the result to the DA converter and the first offset calculation section.

One aspect of the polar modulation transmission circuit of the present invention is the polar modulation transmission circuit that generates and outputs a transmission signal based on input data, the circuit employs a configuration having: an amplitude phase extraction section that extracts amplitude data and phase data from the input data; a phase modulation section that performs phase modulation by using the phase data and outputs a phase modulation signal; an amplification section that amplifies the phase modulation signal based on a control voltage and outputs the result as the transmission signal; and an amplitude control section that forms the control voltage according to the amplitude data and supplies the amplification section, where the amplitude control section has: a DA converter that converts the amplitude data into a differential amplitude signal and outputs the result; a level control section that controls a level of the differential amplitude signal output from the DA converter according to transmitting power information that shows output power of the polar modulation transmission circuit; a first offset calculation section that applies a DC offset to match the transmitting power information to the differential amplitude signal output from the level control section; a differential single conversion section that acquires a single-end signal by performing differential single conversion to the differential amplitude signal output from the first offset calculation section, and supplies the single-end signal as the control voltage to the amplification section; a reference voltage generation section that supplies a reference voltage to the differential single conversion section; and a reference voltage adjusting section that calculates gain from the DA converter to the first offset calculation section, by detecting output of the first offset calculation section, adjusts the reference voltage from the reference voltage generation section in order to make the value of the gain to be the defined value, and supplies the result to the DA converter and the first offset calculation section.

One aspect of the polar modulation method of the present invention is the polar modulation method that includes: an amplitude phase extraction step of extracting amplitude data and phase data from input data; a phase modulation step of performing phase modulation using the phase data and outputting a phase modulation signal; an amplification step of amplifying the phase modulation signal based on a control voltage and outputting a transmission signal; and an amplitude control step of forming the control voltage according to the amplitude data and supplying to an amplification section, where the amplitude control step has: a conversion step of converting the amplitude data into a differential amplitude signal; a level control step of controlling level of the differential amplitude signal according to transmitting power information; a first offset calculation step of applying a DC offset to match the transmitting power information to the level controlled differential amplitude signal; a differential single conversion step of forming a single-end signal using as the control voltage at the, amplifier step by performing differential single conversion to the differential amplitude signal where the DC offset is applied; a reference voltage step of generating a reference voltage to use when performing the differential single conversion step; and a reference voltage adjusting step of calculating gain from a DA conversion step to the first offset calculation step by detecting the differential amplitude signal where the DC offset is applied, adjusting the reference voltage acquired at the reference voltage step to make the value of the gain to be the defined value, and forming the reference voltage to use at the DA conversion step and the first offset calculation step.

Advantageous Effects of Invention

According to an amplitude control circuit, polar modulation transmission circuit, and polar modulation method of the present invention, by setting an amplitude control circuit as a differential circuit configuration, and, further, providing level control section that controls the level of a differential amplitude signal according to transmitting power information, the first offset calculation section that gives DC offset to match transmitting power information to a differential amplitude signal output from a level control section, and a differential single conversion section that performs differential single conversion to a differential amplitude signal output from the first offset calculation section and outputs the result, the noise applied to a positive phase signal and a negative phase signal in a differential amplitude signal is cancelled each other, so that it is possible to decrease the output noise and suppress degradation of receiving sensitivity.

In addition, by detecting the output of the first offset calculation section, the present invention calculates the gain from a DA converter to an offset calculation section, adjusts the reference voltage from a reference voltage generation section in order to make the value to be the defined value, and supplies the result to a DA converter and an offset calculation section, so that it is possible to correct the gain from a DA converter to an offset calculation section. As a result, even when a differential signal is used in an amplitude control section of a polar modulation transmission circuit, it is possible to suppress the variation of offset voltage of an amplification section.

DESCRIPTION OF EMBODIMENTS (Background to Reach the Present Invention)

First, before explaining embodiment, the background to reach the present invention will be explained.

The present inventor has thought of providing an amplitude control section as a differential circuit configuration in order to reduce the output noise from the amplitude control section. The present inventor has studied in detail the operation of when providing an amplitude control section as a differential circuit configuration, and found the technique that realizes to further increase performance.

[1] Configuration

First, a configuration will be explained in detail in the case where an amplitude control section is a differential circuit configuration.

Figure 1:
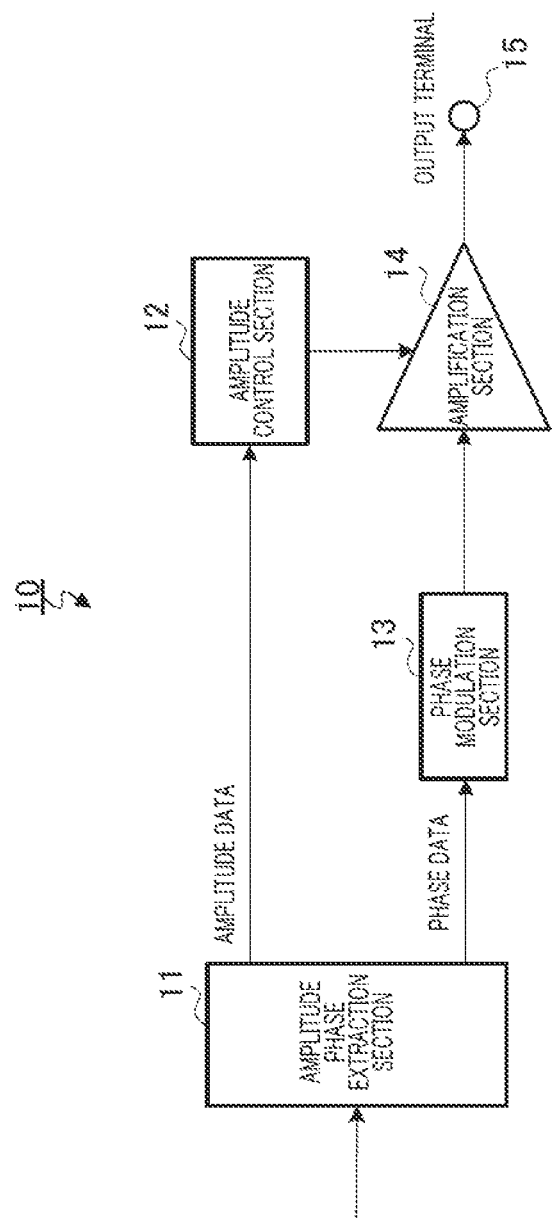
FIG. 1 is a block diagram showing an example of a configuration of a conventional polar modulation transmission circuit.
Figure 2:
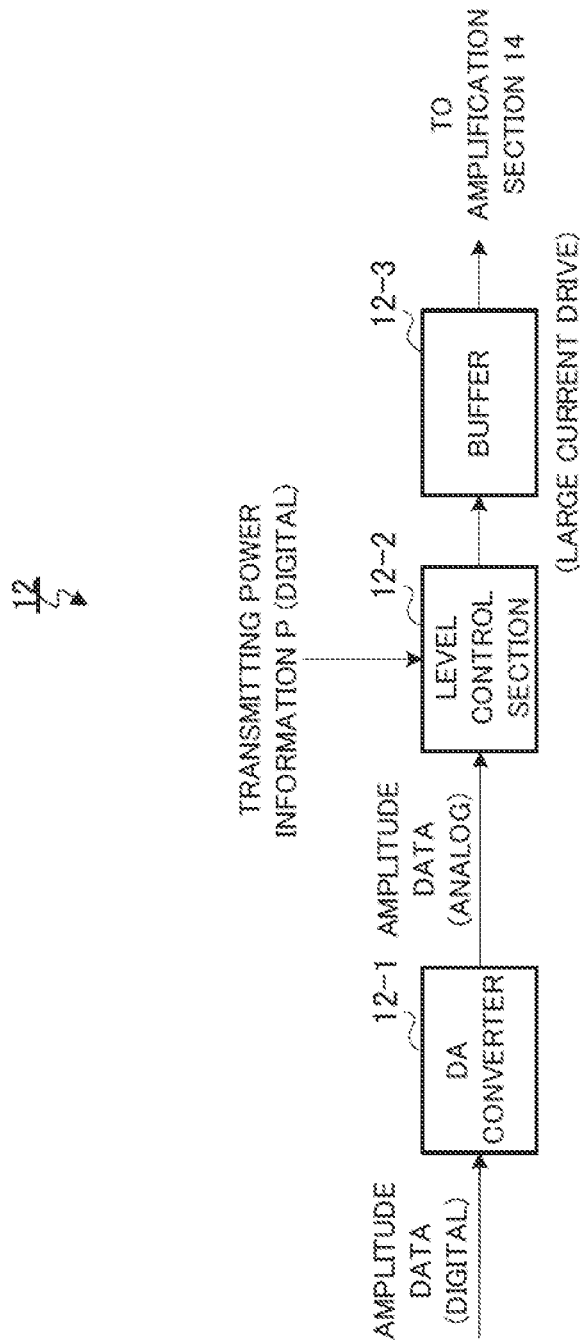
FIG. 2 shows a configuration of an amplitude control section.
Figure 3:
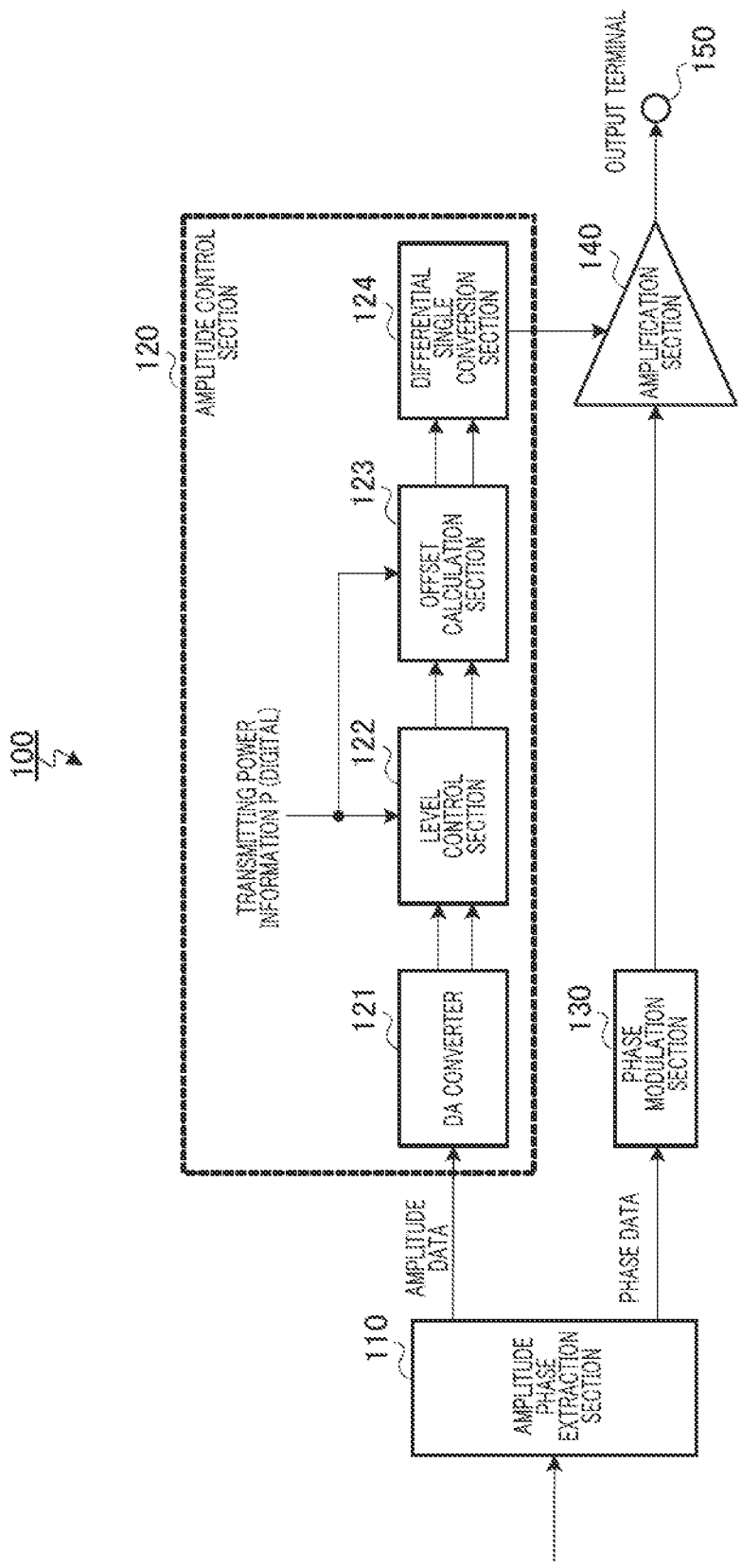
FIG. 3 is a block diagram showing a configuration example of a polar modulation transmission circuit that defines an amplitude control section as a differential circuit configuration.

FIG. 3 shows a specific configuration when an amplitude control section is a differential circuit configuration.

Polar modulation transmission circuit 100 has amplitude phase extraction section 110, amplitude control section 120, phase modulation section 130, amplification section 140, and output terminal 150.

To amplitude phase extraction section 110, modulation data (hereinafter referred to as "input data") is input as data to transmit. From the input data amplitude phase extraction section 110 extracts an amplitude component and a phase component that are digital data, and outputs as amplitude data and phase data.

Amplitude data is input to amplitude control section 120. Amplitude control section 120 supplies voltage controlled depending on amplitude data to amplification section 140. The details of amplitude control section 120 will be described later.

Meanwhile, phase data is input to phase modulation section 130. Phase modulation section 130 performs phase modulation by using the input phase data, and outputs a phase modulation signal. Phase modulation section 130 has to be formed by, for example, a frequency synthesizer. A phase modulation signal is input to amplification section 140. Amplification section 140 amplifies a phase modulation signal depending on voltage supplied from amplitude control section 120. A signal amplified by amplification section 140 is output from output terminal 150 as a transmission signal.

Next, the details of amplitude control section 120 will be described. Amplitude control section 120 has DA converter 121, level control section 122, offset calculation section 123, and differential single conversion section 124. With amplitude control section 120, amplitude data is input to DA converter 121.

DA converter 121 converts the input amplitude data to an analog differential signal, and outputs the analog differential signal as a differential amplitude signal.

The differential amplitude signal output from DA converter 121 is input to level control section 122. To level control section 122, transmitting power information P (that is often represented by a digital signal) that shows the size of average output power of a transmission signal of polar modulation transmission circuit 100. Level control section 122 amplifies or attenuates the input differential amplitude signal by using the gain to match the size of average output power of polar modulation transmission circuit 100 that transmitting power information P shows. Level control section 122 outputs the amplified or attenuated differential amplitude signal to offset calculation section 123.

Offset calculation section 123 calculates DC voltage (equation 1) that is proportional to the difference between the amplitude output from level control section 122 when the gain of level control section 122 is maximum, and the output amplitude of level control section 122 level-controlled depending on the transmitting power information P.

$$Vmax - V \qquad \text{(Equation 1)}$$

Here, Vmax shows the one-side amplitude (peak-to-peak value) of a differential amplitude signal output from level control section 122 when the gain of level control section 122 is maximized. Also, V indicates the one-side amplitude (peak-to-peak value) of a differential amplitude signal that is actually output from level control section 122, that is level-controlled according to the transmitting power information. V varies based on transmitting power information P.

Assuming that the maximum gain of level control section 122 is Gmax, and the actual gain of level control section 122 is G, it is possible to represent (Vmax−V) as equation 2.

$$V\text{max}-V=(1-G/G\text{max})\cdot V\text{max} \quad \text{(Equation 2)}$$

Thus, if gain G of level control section 122 that is set depending on transmitting power information P is known by acquiring in advance the maximum gain Gmax of level control section 122 and the output amplitude Vmax in the maximum gain Gmax, amplitude V actually output from level control section 122 can be acquired, so that offset calculation section 123 can calculate the DC voltage that should be applied to a differential amplitude signal, without monitoring the output of level control section 122. The actual G of level control section 122 varies according to transmitting power information P. Therefore, for example, offset calculation section 123 calculates the DC voltage by maintaining the association between transmitting power information P and gain G, selecting gain G according to transmitting power information P, and substituting the selected gain G in equation 2.

In this way, offset calculation section 123 calculates DC voltage (Vmax−V) that is proportional to the difference between the output amplitude of level control section 122 when the gain of level control section 122 is maximum, and the output amplitude of level control section 122 level-controlled depending on the transmitting power information P. Offset calculation section 123 applies the calculated DC voltage (Vmax−V) to the differential amplitude signal output from level control section 122.

[2] Operation

Next, the operations of amplitude control section 120 of FIG. 3 will be described.

The DC voltage applied at offset calculation section 123 will be explained using FIG. 4 and FIG. 5. FIG. 4 and FIG. 5 are exemplifications and the numbers are by way of examples. The following explanation assumes that a sine wave with a one-side amplitude of 1 Vpp (pp: peak-to-peak) is output from level control section 122 as a differential amplitude signal, when the gain of level control section 122 is maximum gain Gmax.

In FIG. 4 and FIG. 5, a solid line shows a positive phase signal of a differential amplitude signal output from level control section 122, and a broken line shows a negative phase signal of a differential amplitude signal output from level control section 122.

Figures 4A, 4B:
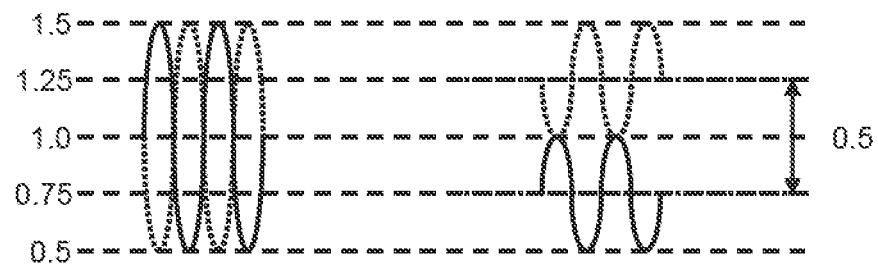
FIG. 4 explains DC voltage applied at an offset calculation section.

FIG. 4A shows the waveform when gain G of level control section 122 is maximum (Gmax). FIG. 4B shows the waveform after DC voltage is applied to a differential amplitude signal by offset calculation section 123, when gain G of level control section 122 is half of the maximum gain Gmax.

As shown in FIG. 4B, a differential amplitude signal with a one-side amplitude of 0.5 Vpp is output from level control section 122, when gain G of level control section 122 is half of the maximum gain Gmax. In this case, at offset calculation section 123, the DC voltage is calculated as 0.5 V by using equation 2.

Offset calculation section 123 applies the DC voltage to a differential amplitude signal, so that a positive phase signal and a negative phase signal are offset to be apart by the calculated DC voltage. In an example of FIG. 4B, a positive phase signal and a negative phase signal are shifted by 0.5 V.

In this way, the DC voltage calculated using equation 2 is applied to a differential amplitude signal with a subtractive polarity, to match an offset voltage between a positive phase signal and a negative phase signal output from level control section 122.

Figures 5A, 5B:
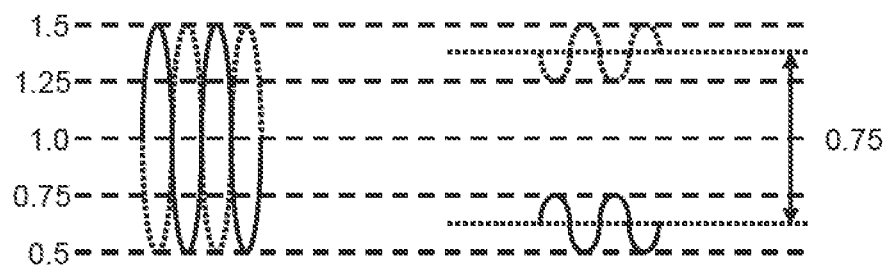
FIG. 5 explains DC voltage applied at an offset calculation section.

FIG. 5A shows the waveform when gain G of level control section 122 is maximum (Gmax). FIG. 5B shows the waveform after DC voltage is applied to a differential amplitude signal by offset calculation section 123, when gain G of level control section 122 is quarter of the maximum gain Gmax.

As shown in FIG. 5B, a differential amplitude signal with a one-side amplitude of 0.25 Vpp is output from level control section 122, when gain G of level control section 122 is quarter of the maximum gain Gmax. In this case, at offset calculation section 123, the DC voltage is calculated as 0.75 V by using equation 2.

Offset calculation section 123 applies the DC voltage to a differential amplitude signal, so that a positive phase signal and a negative phase signal are offset to be apart by the calculated DC voltage. In an example of FIG. 5B, a positive phase signal and a negative phase signal are shifted by 0.75 V.

In this way, the DC voltage calculated using equation 2 is applied to a differential amplitude signal with a subtractive polarity, to match an offset voltage between a positive phase signal and a negative phase signal output from level control section 122.

Figure 6:
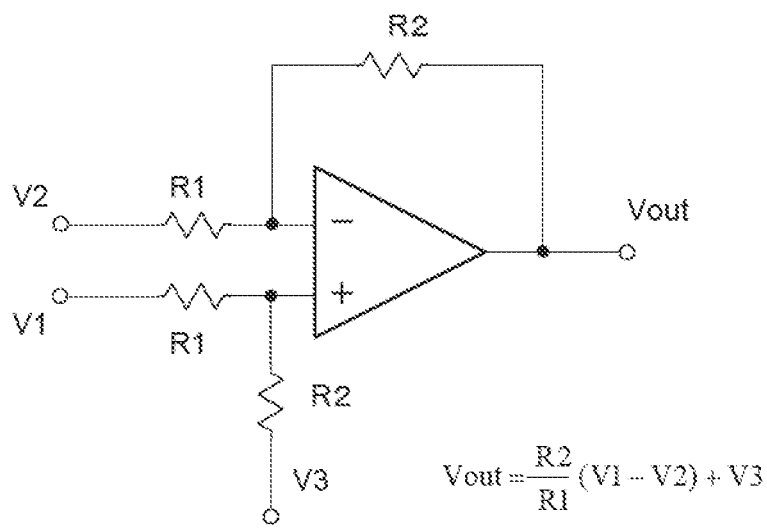
FIG. 6 shows a general circuit configuration of a differential single conversion section.

The output (differential amplitude signal) of offset calculation section 123 is input to differential single conversion section 124, and by differential single conversion section 124, the differential amplitude signal is converted to a single-end amplitude signal. FIG. 6 shows a general circuit configuration of differential single conversion section 124.

Differential single conversion section 124 of FIG. 6 receives as input a positive phase signal and a negative phase signal. After amplifying the value subtracting voltage (V2) of a negative phase signal from voltage (V1) of a positive phase signal, with the provided gain (R2/R1) in advance, differential single conversion section 124 of FIG. 6 adds the predetermined DC voltage (V3) and outputs the result as a single-end amplitude signal.

A single-end amplitude signal is represented by equation 3. As shown in equation 3, differential single conversion section 124 converts a differential signal to single-end amplitude signal Vout that varies around V3.

$$V\text{out}=(R2/R1)(V1-V2)+V3 \quad \text{(Equation 3)}$$

Here, assuming that V1 and V2 are sine waves, the term of (R2/R1) (V1−V2) in equation 3 is a positive-negative symmetric waveform around GND reference (0 V, that is ground potential). Generally, with a power supply supplied to differential single conversion section 124 as shown in FIG. 6, only a positive power supply is used often. In this case, it is not possible to output the voltage lower than GND reference from differential single conversion section 124. Therefore, unless the lower limit (the minimum value of output voltage) of a waveform of an amplitude signal output from differential single conversion section 124 shown in equation 3 is kept so as not to fall below the GND reference, the output waveform will be distorted. To prevent this matter, DC voltage (V3) added at differential single conversion section 124 needs to be half of the maximum amplitude output from differential single conversion section 124. By this way, it is possible to form a power supply supplied to differential single conversion section 124 only by a positive power supply.

External noise of level control section 122 is applied with the same polarity to the voltage (V1) of a positive phase signal and the voltage (V2) of a negative phase signal. Therefore, with differential single conversion section 124, by converting into a single-end signal using equation 3, the external noise applied to a positive phase signal and a negative phase signal is cancelled each other, so that it is possible to reduce the output noise of amplitude control section 120, and, as a result, it is possible to reduce the output noise of amplification section 140.

Compared to the case to use the DA converter that has the same number of bits and performs only D/A conversion without converting into a differential amplitude signal, it is possible to double the dynamic range of DA converter 121 and lessen the gain of differential single conversion section 124 in a later stage of DA converter 121 accordingly, so that it is possible to prevent the noise from being amplified by differential single conversion section 124 and reduce the output noise of amplitude control section 120.

Figure 7A:
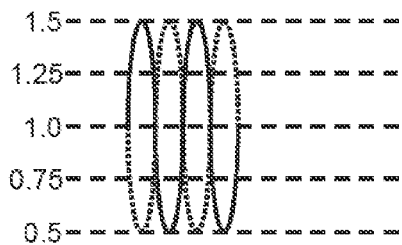
FIG. 7 shows an output waveform of an offset calculation section and a differential single conversion section.
Figure 7B:
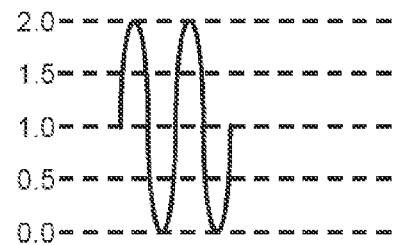
Figure 8A:
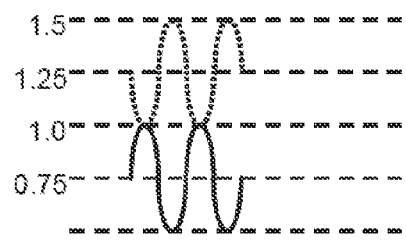
FIG. 8 shows an output waveform of an offset calculation section and a differential single conversion section.
Figure 8B:
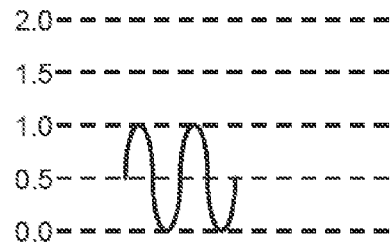

FIG. 7 and FIG. 8 show the output waveforms of offset calculation section 123 and differential single conversion section 124 when a differential amplitude signal is defined as a sine wave. FIG. 7 is the output waveforms of offset calculation section 123 and differential single conversion section 124 when the gain of level control section 122 is maximum, and FIG. 8 is the output waveforms of offset calculation section 123 and differential single conversion section 124 when the gain of level control section 122 is half of the maximum gain Gmax.

In FIG. 7 and FIG. 8, as in FIG. 4 and FIG. 5, a one-side amplitude of a differential amplitude signal, that is output when the gain of level control section 122 is maximum, is defined as 1 Vpp.

Also, the gain of differential single conversion section 124 is ×1, and the predetermined DC voltage (V3) that is added at differential single conversion section 124 is 1 V.

FIG. 7 is an example when the gain of level control section 122 is maximum, and a differential amplitude signal where a one-side amplitude is 1 Vpp is output from level control section 122, so that the maximum output amplitude of differential single conversion section 124 is 2 Vpp. Since V=Vmax holds true in this case, the DC voltage is 0 according to equation 2. Therefore, offset calculation section 123 outputs a differential amplitude signal to differential single conversion section 124 as is.

FIG. 8 is an example of the case when the gain of level control section 122 is half of the maximum gain, and the DC voltage of 0.5 V is applied to a differential amplitude signal at offset calculation section 123. As described above, offset calculation section 123 applies the DC voltage to a differential amplitude signal with a subtractive polarity. Therefore, even when the gain of level control section 122 varies, the minimum limit value of the output waveform of differential single conversion section 124 is fixed at the GND reference, so that the average value of the output waveform is controlled according to the gain of level control section 122. As described above, the output waveform of differential single conversion section 124 is represented by equation 3.

Here, when assuming that a one-side amplitude (peak-to-peak value) of a differential amplitude signal output from level control section 122 if the gain of level control section 122 is maximized is Vmax, and a one-side amplitude (peak-to-peak value) of a differential amplitude signal actually output from level control section 122 is V, offset calculation section 123 applies the DC voltage of (Vmax−V) to a differential amplitude signal output from level control section 122.

Furthermore, assuming that the maximum gain of level control section 122 is Gmax, and the actual gain of level control section 122 is G, it is possible to represent (Vmax−V) as the following equation.

$$V\text{max}-V=(1-G/G\text{max})\cdot V\text{max} \quad \text{(Equation 4)}$$

Thus, when calculating the DC voltage that should be applied to a differential amplitude signal as offset calculation section 123, there is no need to monitor the output of level control section 122, and if the gain setting of level control section 122 the output amplitude at the maximum gain is acquired in advance, the amplitude actually output from level control section 122 is acquired based on the gain setting of level control section 122, so that it is possible to calculate the DC voltage that should be applied to differential amplitude signal. Thus, as shown in FIG. 3, offset calculation section 123 is controlled with control section 122 by transmitting power information P.

Here in FIG. 7, since the gain of differential single conversion section 124 is ×1, and differential single conversion section 124 applies the DC voltage to a differential amplitude signal with a subtractive polarity, the output Vout of differential single conversion section 124 is represented as the following equation, from equation 3 and equation 4.

$$V\text{out}=V1-V2-(1-G/G\text{max})\cdot V\text{max}+V3 \quad \text{(Equation 5)}$$

With equation 5, the term of (1−G/Gmax):Vmax is made by offset calculation section 123 offsetting the offset voltage of a positive phase signal and a negative phase signal to be the DC voltage of equation 2. Therefore, with offset calculation section 123, when the above offset processing is not performed, the output Vout of differential single conversion section 124 is represented by equation 6.

$$V\text{out}=V1-V2+V3 \quad \text{(Equation 6)}$$

Here, by assuming that V1 and V2 as sine waves, the term of (V1−V2) is a positive-negative symmetric waveform around GND reference, and the amplitude varies according to the variation of gain G of level control section 122. Additional explanation will be provided using FIG. 9.

Figure 9A:
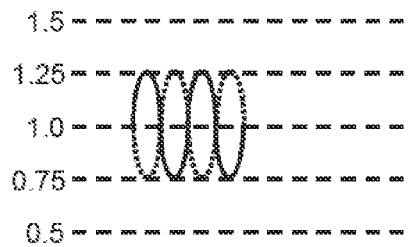
FIG. 9 shows an output waveform of an offset calculation section and a differential single conversion section when offset processing is not performed in an offset calculation section.
Figure 9B:
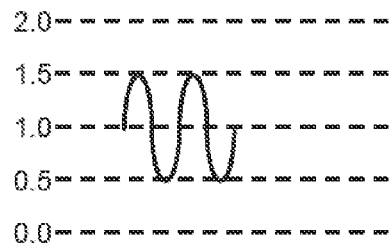

FIG. 9 shows the output waveforms of offset calculation section 123 and differential single conversion section 124 when offset processing is not performed in offset calculation section 123. As shown in FIG. 9, when offset processing is not performed in offset calculation section 123, if the gain of level control section 122, varies, the minimum limit value of the output waveform of differential single conversion section 124 does not match GND reference, and the average value of the output waveforms becomes constant.

The gain of level control section 122 is equivalent to transmitting power information P that shows the average output power of a transmission signal of polar modulation transmission circuit 100, and gain G of level control section 122 varies depending on transmitting power information P. Therefore, the fact that the average value of the output waveform of differential single conversion section 124 becomes constant when gain G of level control section 122 varies means that power control is not performed.

Obviously, if the value of DC voltage (V3) is adjusted according to gain G of level control section 122 to make the minimum value of the output signal of differential single conversion section 124 match the GND reference, it is possible to perform power control without performing offset processing in offset calculation section 123.

However, since, as gain G of level control section 122 lowers, DC voltage (V3) applied at differential single conversion section 124 also lowers, if DC voltage (V3) gets closer to GND, an element that forms a circuit that supplies DC voltage (V3) is not received enough DC bias, so that the accuracy is reduced. In this way, there is a limit to adjust the value of DC voltage (V3), so that the accuracy may be deteriorated.

Meanwhile, with the configuration of FIG. 3, offset calculation section 123 performs the above offset processing, and, by this means, gain G of level control section 122 varies, the term of (1−G/Gmax)·Vmax in equation 5 changes, it is possible to allow the minimum limit value of an output signal of differential single conversion section 124 to match the GND reference. Thus, offset calculation section 123 performs offset processing, and by this means the adjustment of DC voltage (V3) is not necessary. That is, with a configuration of FIG. 3, by applying DC voltage (Vmax−V) to a differential amplitude signal, it is possible to prevent the adjustment of DC voltage (V3). In order to maintain the accuracy, it is enough to maintain the accuracy as differential voltage of the DC voltage (Vmax−V), so that it is possible to increase the accuracy compared to the case to adjust DC voltage (V3).

As described above, amplitude control section 120 of polar modulation transmission circuit 100 of FIG. 3 has DA converter 121 that converts amplitude data into a differential amplitude signal and outputs the result, level control section 122 that controls the level of a differential amplitude signal according to transmitting power information P, offset calculation section 123 that applies the DC voltage to match transmitting power information P to a differential amplitude signal that is level-controlled by level control section 122. By this means, in differential single conversion section 124 in a later stage of offset calculation section 123, by converting a single-end signal using equation 3, the noise where a positive phase signal and a negative phase signal are applied is cancelled each other, so that it is possible to reduce the output noise of amplitude control section 120, and as a result, it is possible to reduce the output noise of amplification section 140.

Compared to the case to use the DA converter that has the same number of bits and performs only D/A conversion without converting into a differential amplitude signal, it is possible to double dynamic range of DA converter 121 and lessen the gain of differential single conversion section 124 in a later stage of DA converter 121 accordingly, so that it is possible to prevent the noise to be amplified by differential single conversion section 124 and reduce the output noise of amplitude control section 120, and as a result it is possible to reduce the output noise of amplification section 140.

Furthermore, with polar modulation transmission circuit 100, since, to a differential amplitude signal level-controlled by level control section 122, offset calculation section 123 applies the DC voltage that is proportional to the difference between the output amplitude of level control section 122 of when the gain of level control section 122 is maximum and the output amplitude of level control section 122 controlled according to transmitting power information P, as the DC offset, even when the gain of level control section 122 varies and the level of the differential amplitude signal varies, adjustment of the DC voltage added in the later stage, differential single conversion section 124, is not required, and the minimum limit value of the output waveform of differential single conversion section 124 is fixed, so that it is possible to accurately perform power control according to transmitting power information P.

[3] Examination of an Amplitude Control Section of a Differential Circuit Configuration As above, by providing an amplitude control section as a differential circuit configuration, it is possible to provide various advantages. The present inventor has considered to improve the transmission performance of a polar modulation transmission circuit. The items for consideration will be described below.

With amplitude control section 120 of polar modulation transmission circuit 100 shown in FIG. 3, the variation of gain from DA converter 121 to offset calculation section 123 and the variation of amplitude of a differential signal input to differential single conversion section 124 results in the variation of the output minimum limit level of differential single conversion section 124. This reason will be described below.

A general circuit configuration of differential single conversion section 124 is as shown in FIG. 6. As. shown in equation 3, when the differential signals V1 and V2 are input, differential single conversion section 124 amplifies the voltage, that is calculated by subtracting voltage (V2) of reverse input from voltage (V1) of in-phase input, with the previously provided gain (R2/R1), applies fixed DC voltage (V3) to the voltage acquired by this means, and outputs the result. By this means, differential single conversion section 124 converts a differential signal to a single-end amplitude signal that changes around V3.

Therefore, the variation of the amplitude of a differential signal input to differential single conversion section 124, that is, the variation of the term of (V1−V2) in equation 3 results in the variation of the output minimum limit level of differential single conversion section 124.

The output minimum limit level of differential single conversion section 124 means the minimum output of a DA converter, that is, zero level of amplitude data. Thus, the variation of the output minimum level of differential single conversion section 124 means that the zero level of the amplitude data will vary. This is equivalent to adding unnecessary offset to the amplitude data, and by this means the modulation characteristic may be deteriorated.

In this way, with a configuration as shown in FIG. 3 where the output from level control section 122 is assumed as a differential signal and the offset voltage acquired by performing differential single conversion is input to amplification section 140, the present inventor has thought that the offset voltage of amplification section 140 varies easily by varying the amplitude of a differential signal input to differential single conversion section 124. The variation of the offset voltage of amplification section 140 means the variation of the zero level of amplitude data. Therefore, the result of the study has been acquired that by using a differential circuit configuration as in FIG. 3, the zero level of amplitude data varies, and by this means that the modulation characteristic may be deteriorated.

Based on the above consideration, the present inventor has reached the present invention by further improving the configuration of FIG. 3.

Embodiments of the present invention will be described in detail with reference to the accompanying drawings.

(Embodiment 1)

[1] Configuration

Figure 10:
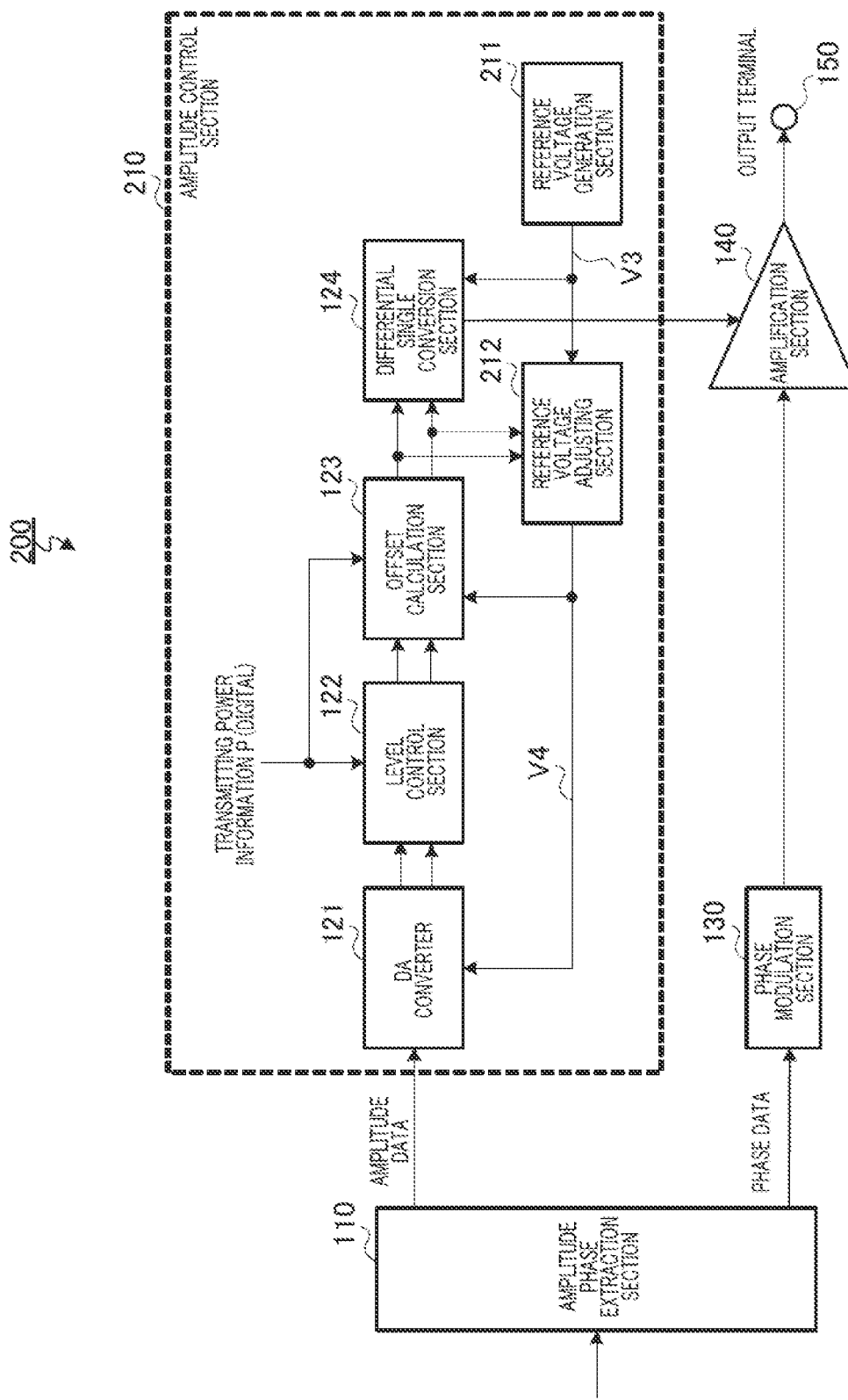
FIG. 10 is a block diagram showing a configuration example of a polar modulation transmission circuit according to embodiment 1 of the present invention.

FIG. 10, where parts that are the same as in FIG. 3 are assigned the same reference numerals as in FIG. 3, shows a configuration example of a polar modulation transmission circuit according to embodiment 1 of the present invention.

Polar modulation transmission circuit 200 has amplitude phase extraction section 110, amplitude control section 210, phase modulation section 130, amplification section 140, and output terminal 150.

Amplitude control section 210 has DA converter 121, level control section 122, offset calculation section 123, differential single conversion section 124, reference voltage generation section 211, and reference voltage adjusting section 212.

Compared to amplitude control section 120 of FIG. 3, reference voltage generation section 211 and reference voltage adjusting section 212 are added to amplitude control section 210 of polar modulation transmission circuit 200 of the present embodiment.

Reference voltage adjusting section 212 inputs reference voltage V3 generated by reference voltage generation section 211 and the output voltage of offset calculation section 123 at the same time, and outputs reference voltage V4 adjusted according to output voltage of offset calculation section 123 to DA converter 121 and offset calculation section 123. In other words, reference voltage adjusting section 212 detects the output of offset calculation section 123, and corrects the reference voltage to use at DA converter 121 and offset calculation section 123, according to the detection result.

Specifically, by detecting the output of offset calculation section 123, reference voltage adjusting section 212 calculates the gain from DA converter 121 to offset calculation section 123, adjusts reference voltage V3 from reference voltage generation section 211 in order to make the value to be the defined value, and, by supplying adjusted reference voltage V4 to DA converter 121 and offset calculation section 123, corrects the gain from DA converter 121 to offset calculation section 212 to be the defined value. The reference voltage adjustment operation of this reference voltage adjusting section 212 will be described later.

By using reference voltage V4 from reference voltage adjusting section 212, DA converter 121 converts the amplitude data into an analog differential signal, and outputs this as a differential amplitude signal.

A differential amplitude signal output from DA converter 121 is input to level control section 122. Also, transmitting power information P that shows the size of the average output power of a transmission signal of polar modulation transmission circuit 200 is input to level control section 122. Level control section 122 amplifies or attenuates the input differential amplitude signal by using the gain to match the size of the average output power of polar modulation transmission circuit 200 that transmitting power information P shows. Level control section 122 outputs the amplified or attenuated differential amplitude signal to offset calculation section 123.

From transmitting power information P, offset calculation section 123 calculates DC voltage (Vmax−V) that is proportional to the difference between the amplitude output from level control section 122 when the gain of level control section 122 is maximum, and the output amplitude of level control section 122 level-controlled according to the transmitting power information P. Since how to calculate this DC voltage has been explained above, the explanation will be omitted here. Offset calculation section 123 of the present embodiment generates this DC voltage using reference voltage V4 from reference voltage adjusting section 212, and supplies the generated DC voltage to a differential amplitude signal output from level control section 122.

[2] Operation

Next, the operations of the present embodiment will be described. Since polar modulation transmission circuit 200 of the present embodiment mainly features the operation of amplitude control section 210, the operation of amplitude control section 210 will be explained below. Furthermore, in below, for ease of explanation of the operation of amplitude control section 210 of the present embodiment, the operation of when reference voltage is not adjusted (corrected) as the configuration of FIG. 3 will be explained first, and the operation of when reference voltage is adjusted (corrected) as the configuration of FIG. 10 will be explained next.

[2-1] When Reference Voltage is Not Adjusted (Corrected)

FIG. 11 and FIG. 12 show the situation of output of offset calculation section 123 and output of differential single conversion section 124, when reference voltage is not adjusted. FIG. 11 and FIG. 12 are exemplifications and the numbers are by way of examples.

Figure 11A:
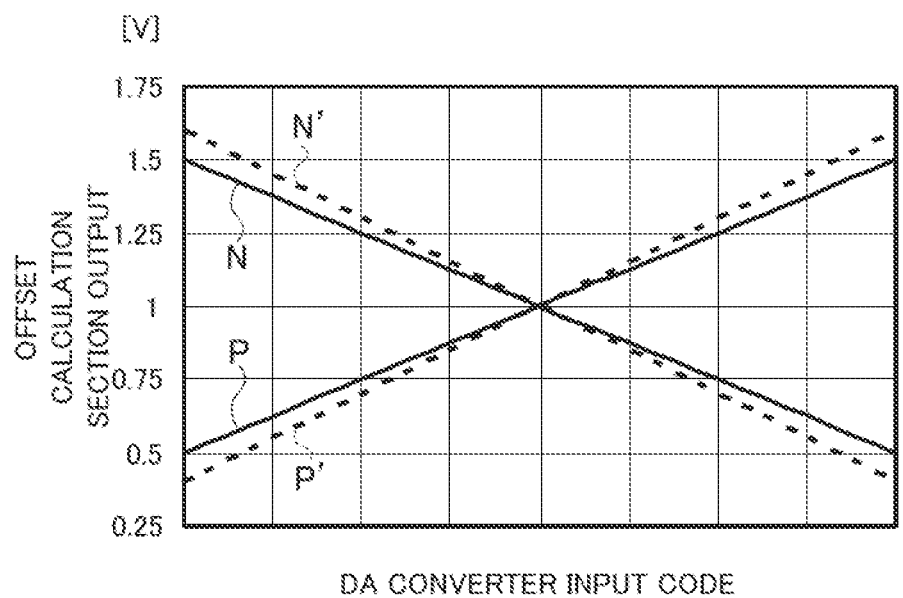
FIG. 11A shows an output characteristic of an offset calculation section in the case where the gain of a level control section is maximum.
Figure 11B:
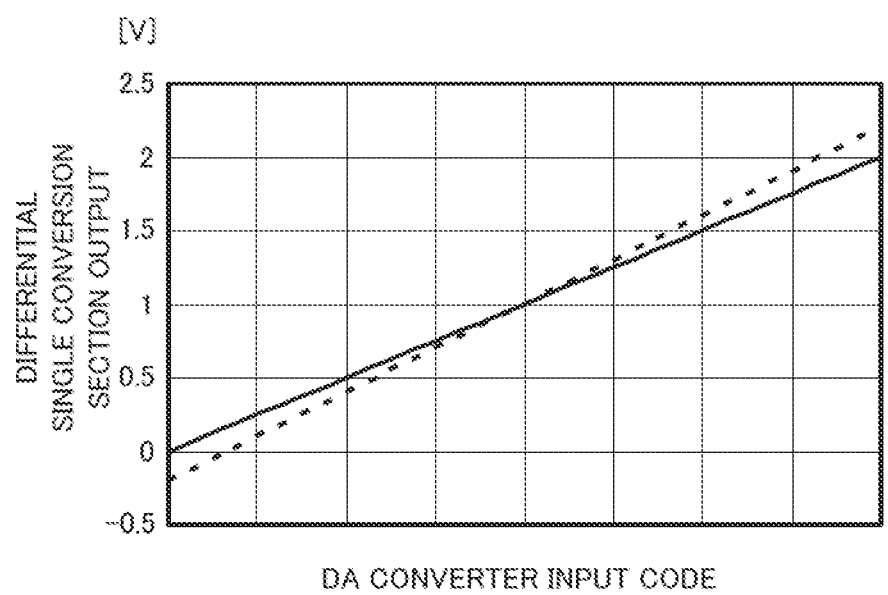
FIG. 11B shows an output characteristic of a differential single conversion section in the case where the gain of a level control section is maximum.

FIG. 11 shows the output characteristic (FIG. 11A) of offset calculation section 123 and the output characteristic (FIG. 11B) of differential single conversion section 124 when gain G of level control section 122 is maximum (Gmax). In FIG. 11, a solid line shows the output characteristic of when the gain from DA converter 121 to offset calculation section 123 operates ideally. Among two straight lines of FIG. 11A, oue straight line P shows in-phase output in the, differential output, and the other straight line N shows reverse phase output in the differential output. A dotted-line shows the output characteristic of when the gain of DA converter 121 increases 20% from the ideal situation shown by a solid line.

Figure 12A:
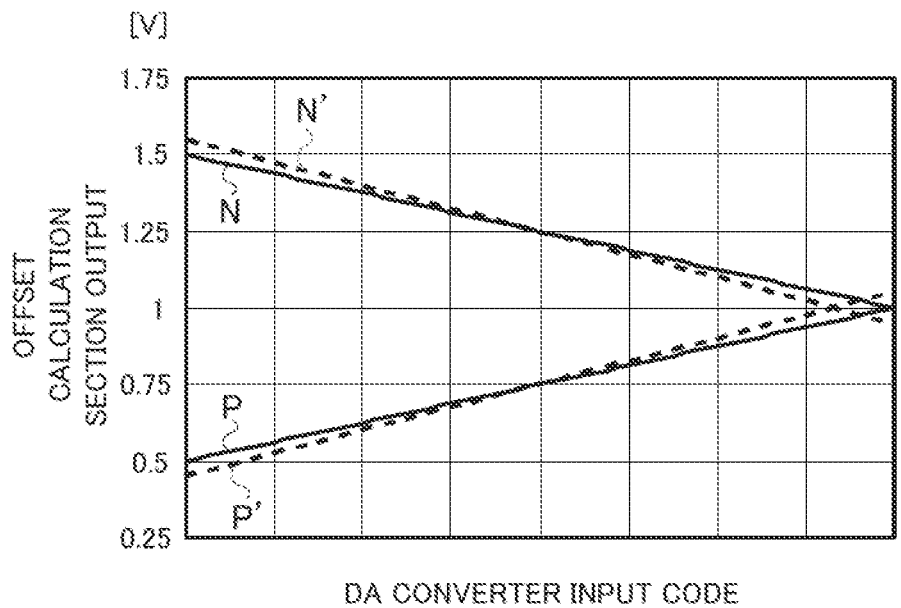
FIG. 12A shows an output characteristic of an offset calculation section in the case where the gain of a level control section is half of the maximum gain.
Figure 12B:
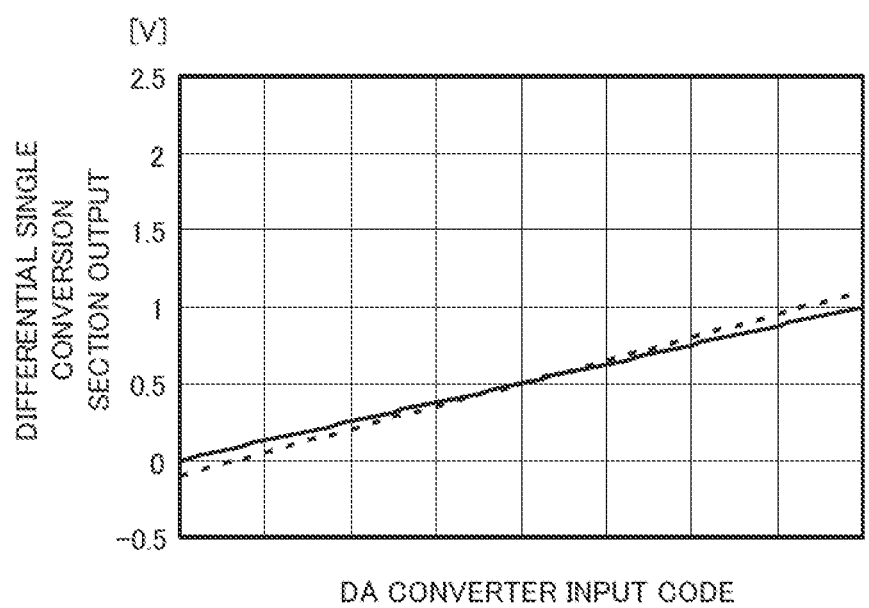
FIG. 12B shows an output characteristic of a differential single conversion section in the case where the gain of a level control section is half of the maximum gain.

FIG. 12 shows the output characteristic (FIG. 12A) of offset calculation section 123 and the output characteristic (FIG. 12B) of differential single conversion section 124 when gain G of level control section 122 is half of the maximum (Gmax). In FIG. 12, a solid line shows the output characteristic of when the gain from DA converter 121 to offset calculation section 123 operates ideally. Among two straight lines of FIG. 12A, one straight line P shows in-phase output in the differential output, and the other straight line N shows reverse phase output in the differential output. A dotted-line shows the output characteristic of when the gain of DA converter 121 increases 20% from the ideal situation shown by a solid line.

As an example of FIG. 4, FIG. 11 and FIG. 12 show examples: the one-side amplitude of a differential amplitude signal that is output when the gain of level control section 122 is maximized is 1 Vpp; the gain of differential single conversion section 124 is 1 (where the maximum output amplitude is 2 Vpp); and fixed DC voltage (V3) added at differential single conversion section 124 is 1 V.

As shown in FIG. 11B and FIG. 12B, although the output minimum level of differential single conversion section 124 is zero in an ideal operation (solid line), the output minimum level is less than zero when the gain of DA converter 121 increases 20%.

In this way, if the gain from DA converter 121 to offset calculation section 123 varies, and by this means the change of the amplitude of a differential signal input to differential single conversion section 124. results in the variation of the output minimum level of differential single conversion section 124. If the output minimum level of differential single conversion section 124 varies, the modulation characteristic is deteriorated as described above.

[2-2] When Reference Voltage is Adjusted (Corrected)

FIG. 13 and FIG. 14 show the situation of output of offset calculation section 123 and output of differential single conversion section 124, when reference voltage adjusted (when the configuration of the present embodiment is applied). FIG. 13 and FIG. 14 are exemplifications and the numbers are by way of examples.

Figure 13A:
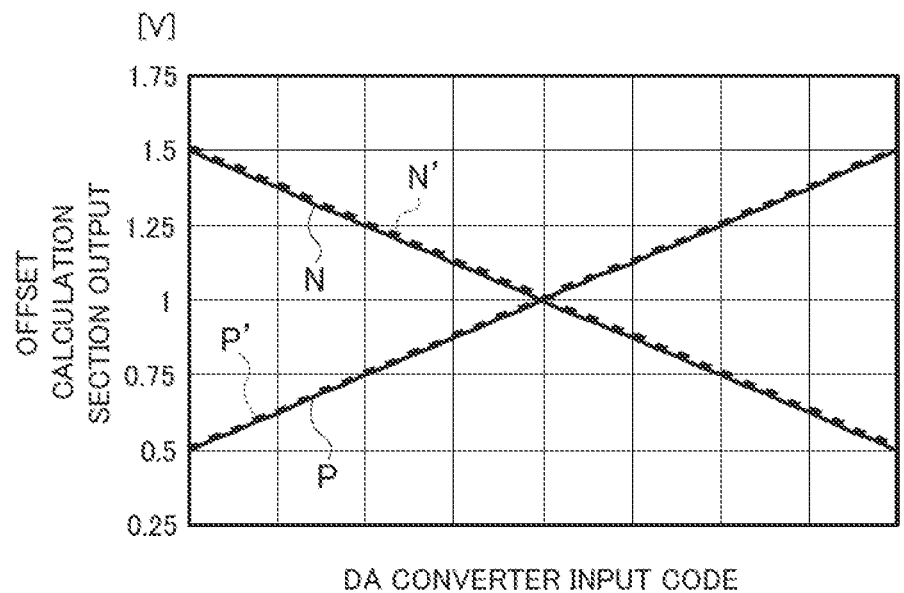
FIG. 13A shows an output characteristic of an offset calculation section in the case where the gain of a level control section is maximum when reference voltage is adjusted.
Figure 13B:
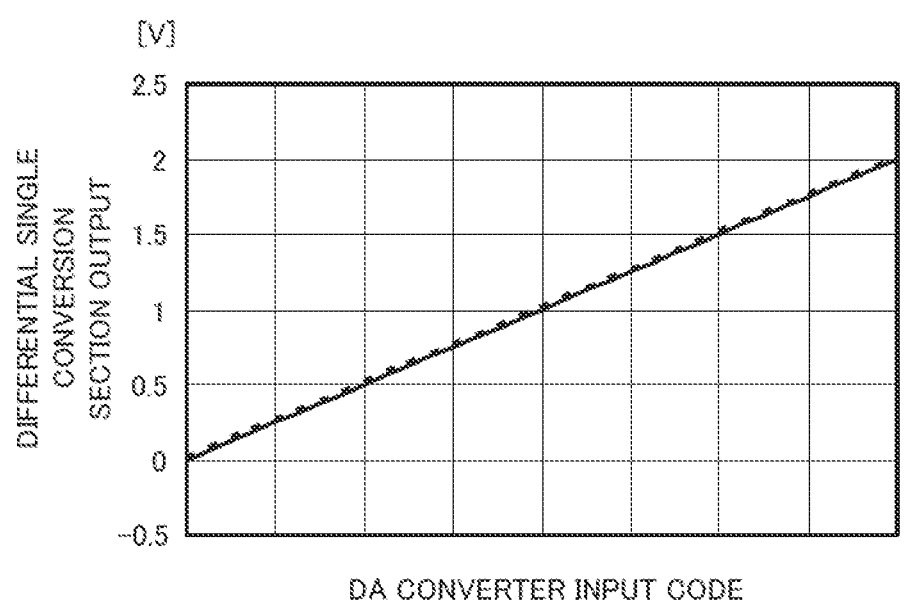
FIG. 13B shows an output characteristic of a differential single conversion section in the case where the gain of a level control section is maximum when reference voltage is adjusted.

FIG. 13 shows the output characteristic (FIG. 13A) of offset calculation section 123 and the output characteristic (FIG. 13B) of differential single conversion section 124 when gain G of level control section 122 is maximum (Gmax). In FIG. 13, a solid line shows the output characteristic of when the gain from DA converter 121 to offset calculation section 123 operates ideally. Among two straight lines of FIG. 13A, one straight line P shows in-phase output in the differential output, and the other straight line N shows reverse phase output in the differential output. A dotted-line shows the output characteristic after adjusting reference voltage V4 by reference voltage adjusting section 212, from the situation shown in FIG. 11 where the gain of DA converter 121 increases 20% from the ideal situation shown by a solid FIG. 13 shows that by adjusting reference voltage V4, it is possible to correct the output characteristics of offset calculation section 123 and differential single conversion section 124 to an ideal characteristics.

Figure 14A:
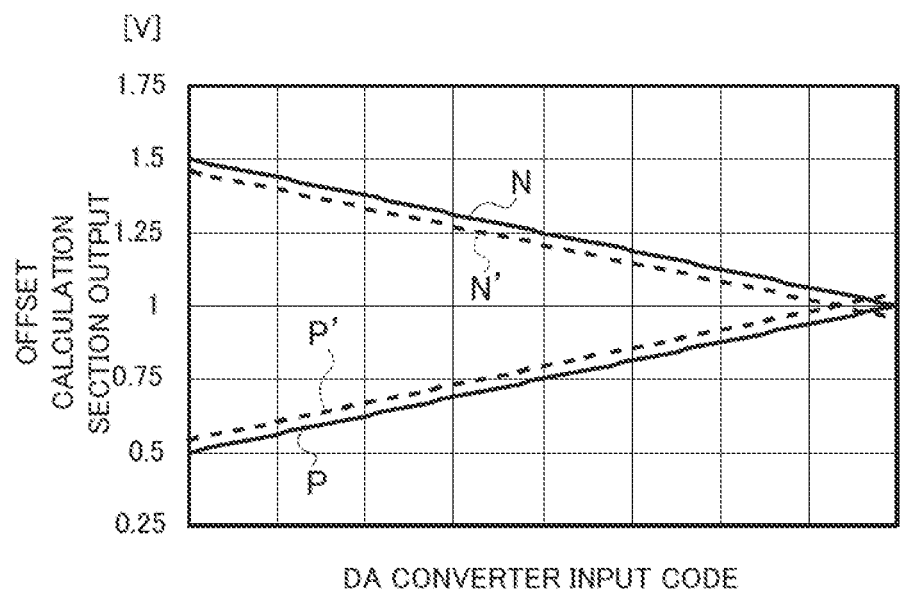
FIG. 14A shows an output characteristic of an offset calculation section in the case where the gain of a level control section is half of the maximum when reference voltage is adjusted.
Figure 14B:
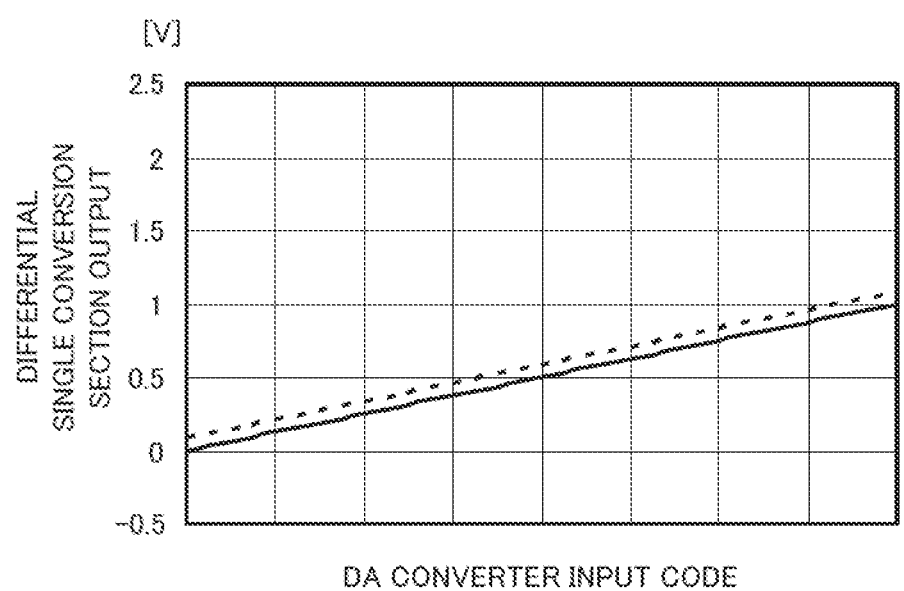
FIG. 14B shows an output characteristic of a differential single conversion section in the case where the gain of a level control section is half of the maximum when reference voltage is adjusted.

FIG. 14 shows the output characteristic of offset calculation section 123 (FIG. 14A) and output characteristic of differential single conversion section 124 (FIG. 14B) when gain G of level control section 122 is half of the maximum gain (Gmax). In FIG. 14, a solid line shows the output characteristic of when the gain from DA converter 121 to offset calculation section 123 operates ideally. Among two straight lines of FIG. 14A, one straight line P shows in-phase output in the differential output, and the other straight line N shows reverse phase output in the differential output. A dotted-line shows the output characteristic after adjusting reference voltage V4 by reference voltage adjusting section 212, from the situation shown in FIG. 12 where the gain of DA converter 121 increases 20% from the ideal situation shown by a solid line. FIG. 14 shows that by adjusting reference voltage V4, it is possible to correct the output characteristics of offset calculation section 123 and differential single conversion section 124 to an ideal characteristics.

[2-3] Operation of Reference Voltage Adjusting Section

Next, the adjustment operations of reference voltage V4 by reference voltage adjusting section 212 will be described.

Based on the output voltage of offset calculation section 123, reference voltage adjusting section 212 generates reference voltage V4 that cancels overall gain variation at DA converter 121, level control section 122, and offset calculation section 123, and outputs this reference voltage V4 as the reference voltage of DA converter 121 and offset calculation section 123.

It is possible to easily detect the gain from DA converter 121 to offset calculation section 123, for example, by reading the differential voltage between in-phase output and reverse phase output of offset calculation section 123 when the gain of level control section 122 is provided as maximum and the input code of DA converter 121 is maximized.

For example, in an example shown in FIG. 11A, upon an ideal operation, the differential voltage between in-phase output and reverse phase output of offset calculation section 123 of when the input code of DA converter 121 is maximized is 1 V. By contrast with this, when the gain of DA converter 121 increases 20%, the differential voltage is larger as 1.2 V. In this case, reference voltage adjusting section 212 multiplies reference voltage V3 of reference voltage generation section 211 by 1/1.2 times and then supplies the result to DA converter 121 and offset calculation section 123. Thus, reference voltage V4 supplied to DA converter 121 and offset calculation section 123 is V4=V3×(1/1.2).

By this means, the gain of DA converter 121 is 1/1.2, and the gain from DA converter 121 to offset calculation section 123 is corrected. By correcting the characteristic of FIG. 11 as above, it is possible to achieve the characteristic of FIG. 13. By correcting the characteristic of FIG. 12 as above, it is possible to achieve the characteristic of FIG. 14.

[3] Effect

As described above, by detecting the output of offset calculation section 123, the present embodiment calculates the gain from DA converter 121 to offset calculation section 123, adjusts reference voltage V3 from reference voltage generation section 211 in order to make the value to be the defined value, and provides reference voltage adjusting section 212 that supplies adjusted reference voltage V4 to DA converter 121 and offset calculation section 123. By this means, it is possible to correct the gain from DA converter 121 to offset calculation section 123. As a result, since it is possible to suppress the variation of the output minimum level of differential single conversion section 124, it is possible to suppress the addition of unnecessary offset to amplitude data in amplification section 140. Thus, when assuming amplitude control section 210 as a differential circuit configuration, it is possible to. suppress the deterioration of the modulation characteristic.

Also, it is possible to lessen a circuit scale to adjust the reference voltage, by adjusting the reference voltage by one reference voltage adjusting section 212, and supplying the same reference voltage V4 to DA converter 121 and offset calculation section 123, not by providing reference voltage adjusting sections to DA converter 121 and offset calculation section 123 respectively.

(Embodiment 2)

The present embodiment presents a configuration that can move output the characteristics closer to the ideal operation regardless of the gain of level control section 122.

Here, when a configuration such as embodiment 1 is applied, as shown in FIG. 13, when the gain of level control section 122 is maximum, it is possible to perfectly match the output characteristic of offset calculation section 123 and differential single conversion section 124 to an ideal operation. Meanwhile, as shown in FIG. 14, when the gain of level control section 122 is half of the maximum gain, the output characteristic of offset calculation section 123 and differential single conversion section 124 is slipped off as shifted from the ideal operation.

This is because the influence by reference voltage adjusting section 212 multiplying the reference voltage of reference voltage generation section 211 by 1/1.2 times reflects in offset calculation section 123. As described above, from power information P, offset calculation section 123 calculates the amount of the DC voltage that is proportional to the amplitude output when the gain of level control section 122 is maximum, and the amplitude actually output from level control section 122, generates this voltage by using reference voltage V4 (=V3×(1/1.2)) acquired by reference voltage adjusting section 212, and applies this voltage to a differential amplitude signal output from level control section 122. For this reason, if adjusted reference voltage V4 is 1/1.2 times of reference voltage V3 before adjustment, the voltage that should be originally applied to a differential signal is also multiplied by 1/1.2 times (note that subtractive polarity is applied for a differential amplitude signal), and the output of differential single conversion section 124 shifts upward against the ideal operation.

Thus, if the reference voltage supplied to DA converter 121 and offset calculation section 123 is changed by reference voltage adjusting section 212 in order to correct the gain from DA converter 121 to offset calculation section 123, the balance between the output amplitude of level control section 122 and the voltage added at offset calculation section 123 collapses. For this reason, when the gain of level control section 122 is maximum (when the voltage added at offset calculation section 123 is zero), the output characteristic matches the ideal operation, but when the gain of level control section 122 is not maximum (when the voltage added at offset calculation section, 123 is not zero), the output characteristic misaligns from the ideal operation.

Figure 15:
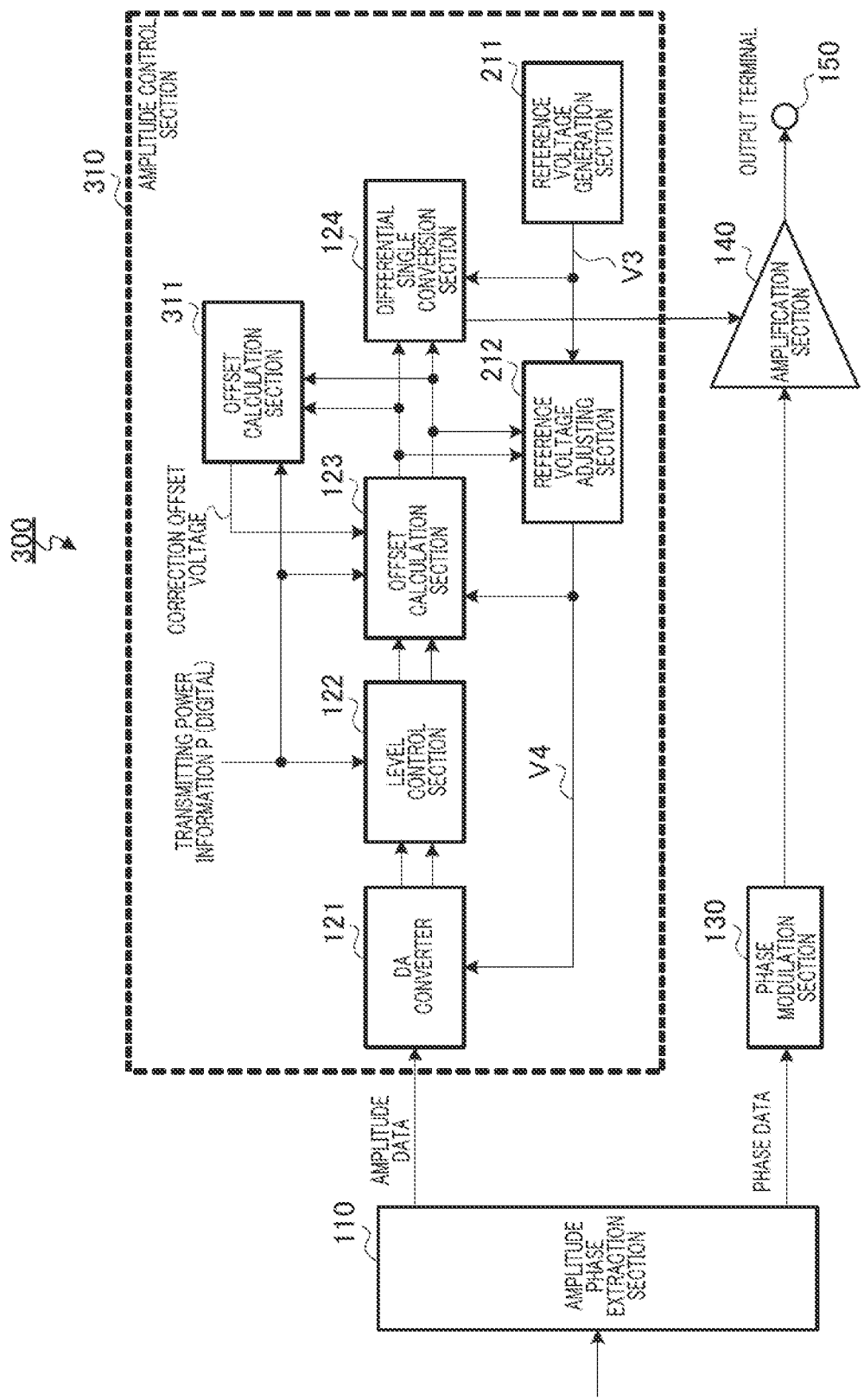
FIG. 15 is a block diagram showing a configuration example of a polar modulation transmission circuit of embodiment 2.

FIG. 15, where parts that are the same as in FIG. 10 are assigned the same reference numerals as in FIG. 10, shows a configuration example of a polar modulation transmission circuit according to the present embodiment. Especially, polar modulation transmission circuit 300 of the present embodiment is also suitable for correcting the offset shift after the gain correction.

Polar modulation transmission circuit 300 differs from polar modulation transmission circuit 200 of embodiment 1 in that amplitude control section 310 has second offset calculation section 311 in addition to first offset calculation section 123. In order to separate offset calculation sections 123 and 311, hereinafter referred to the former as the first offset calculation section and the latter as the second offset calculation section.

Second offset calculation section 311 receives as input the output of first offset calculation section 123 and transmitting power information P, and, based on them, calculates correction offset voltage (corrected offset voltage), and outputs this correction offset voltage to first offset calculation section 123. To the output of level control section 122, first offset calculation section 123 applies correction offset voltage in addition to the DC voltage calculated as embodiment 1. Thus, when the gain of level control section 122 is not maximum due to the correction of the gain from DA converter 121 to first offset calculation section 123, and if the output characteristic of first offset calculation section 123 misaligns from the ideal operation, second offset calculation section 311 calculates correction offset voltage to correct the offset shift from transmitting power information P, and supplies the result to first offset calculation section 123. This operation will be described below.

As described above, when assuming that a one-side amplitude (peak-to-peak value) of a differential amplitude signal output from level control section 122 when the gain of level control section 122 is maximized is Vmax, and a one-side amplitude (peak-to-peak value) of a differential amplitude signal actually output from level control section 122 is V, first offset calculation section 123 applies the DC voltage of (Vmax−V) to a differential amplitude signal output from level control section 122. Supposedly, if reference voltage V4 is adjusted by 1/1.2 times of reference voltage V3 by reference voltage adjusting section 212, first offset calculation section 123 applies the DC voltage, in which (Vmax−V)/1.2 holds, to a differential amplitude signal output from level control section 122. Thus, (1−1/1.2)×(Vmax−V) is proportional to the gap from the ideal operation, and second offset calculation section 311 calculates this gap from the ideal operation as the correction offset voltage.

When the present embodiment is applied to the example shown in FIG. 14, Vmax=1 V and V=0.5 V hold, so that it is possible to easily calculate the above gap from the ideal operation, that is, the correction offset voltage, as approximately 83 mV. Thus, only by calculating how the differential voltage of a differential amplitude signal output from offset calculation section 123 of when V is not Vmax, in other words, level control section 122 is not the maximum gain, is misaligned from the ideal operation, even if power information P changes and V changes, it is possible to easily calculate the correction offset voltage to match power information P since Vmax is known.

As explained above, according to the present embodiment, in addition to the configuration of embodiment 1, by calculating the correction offset voltage based on the output of first offset calculation section 123 and transmitting power information P, and by providing second offset calculation section 311 that adds this correction offset voltage to the output of first offset calculation section 123, it is possible to move the output characteristic closer to the ideal operation regardless of the gain of level control section 122.

Although the present embodiment has described a case where the correction offset voltage calculated by second offset calculation section 311 is added at first offset calculation section 123, the same effect can be acquired by adding the correction offset voltage at differential single conversion section 124 (that is, to a single-end signal that is the output of differential single conversion section 124). Also, the position on a circuit, where the correction offset voltage is added, may be the inside or outside of first offset calculation section 123 or differential single conversion section 124.

(Embodiment 3)

Figure 16:
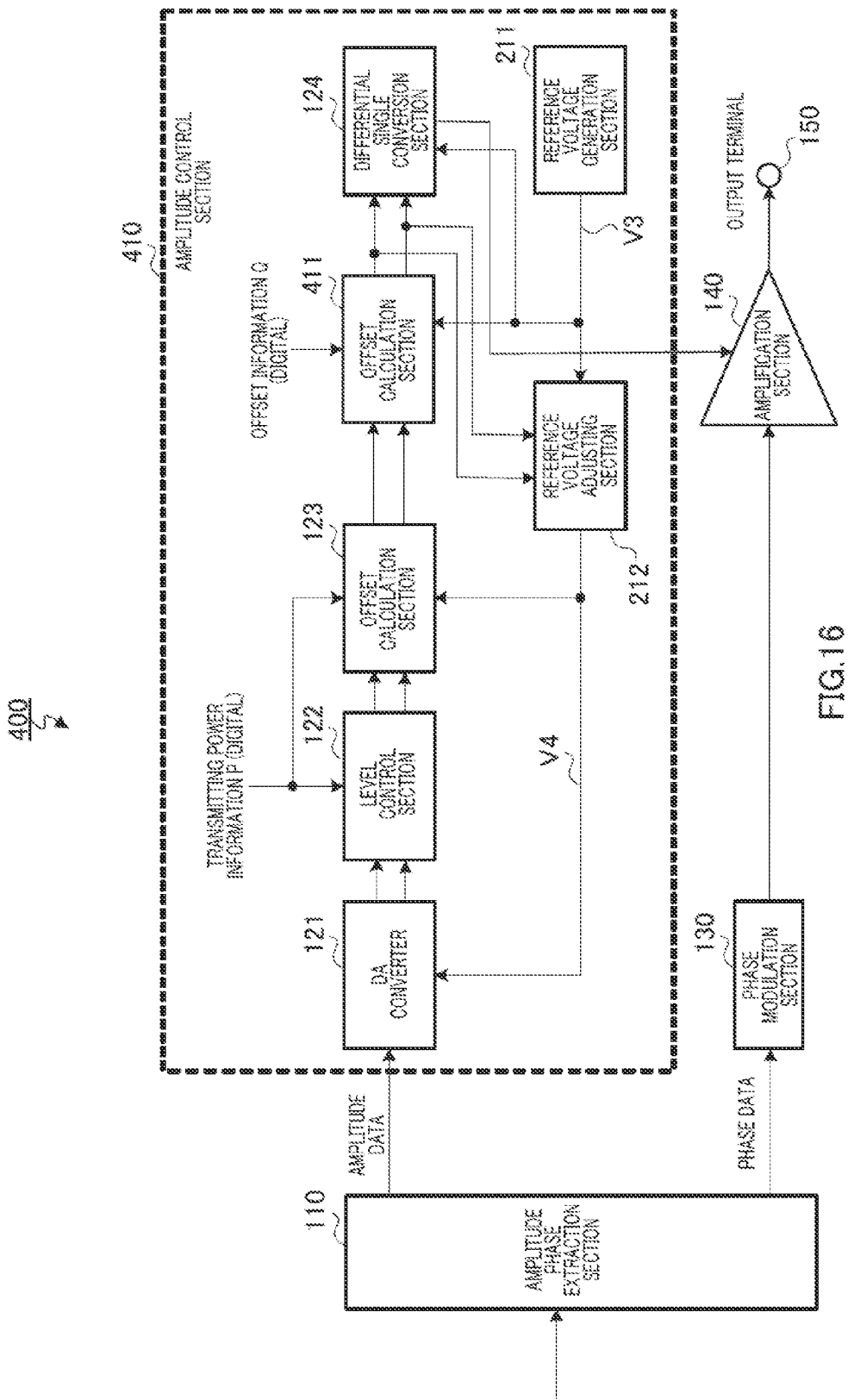
FIG. 16 is a block diagram showing a configuration example of a polar modulation transmission circuit of embodiment 3.

FIG. 16, where parts that are the same as in FIG. 10 are assigned the same reference numerals as in FIG. 10, shows a configuration example of a polar modulation transmission circuit according to the present embodiment. Polar modulation transmission circuit 400 of the present embodiment is preferable especially when a power amplifier using a hetero bipolar transistor (HBT) is used for amplification section 140.

Compared to amplitude control section 210 of embodiment 1, amplitude control section 410 of the present embodiment has a configuration where second offset calculation section 411 is added between first offset calculation section 123 and differential single conversion section 124. In order to separate offset calculation sections 123 and 411, hereinafter referred to the former as the first offset calculation section and the latter as the second offset calculation section.

To second offset calculation section 411, offset information Q (which is often represented by a digital signal) showing the size of the offset voltage (hereinafter referred to as "amplification section offset voltage") that is inherent to amplification section 140 is input. Offset information Q differs from transmitting power information P input to first offset calculation section 123. The details of amplification section offset voltage will be described later.

Reference voltage adjusting section 212 calculates the gain from DA converter 121 to first offset calculation section 411 by detecting the output of second offset calculation section 411. In this case, it is preferable for offset information Q to input information indicating that the amplification section offset voltage is proportional to zero. By providing as above, the amplification section offset voltage is not included in the output of second offset calculation section 411, so that it is possible to apply the same correction method as embodiment 1. Also, in order to make the value of the gain to be the defined value, reference voltage adjusting section 212 adjusts input reference voltage V3, and supplies adjusted reference voltage V4 to DA converter 121 and first offset calculation section 123.

Based on offset information Q, second offset calculation section 411 applies the amplification section offset voltage generated by using reference voltage V3 output from reference voltage generation section 211, to a differential amplitude signal output from first offset calculation section 123. In FIG. 16, although second offset calculation section 411 is arranged between offset calculation section 123 and differential single conversion section 124, there is no operational problem even to arrange before offset calculation section 123 or after differential single conversion section 124. However, when second offset calculation section 411 is arranged after differential single conversion section 124, the amplification section offset voltage will be applied to a single-end amplitude signal.

Figure 17:
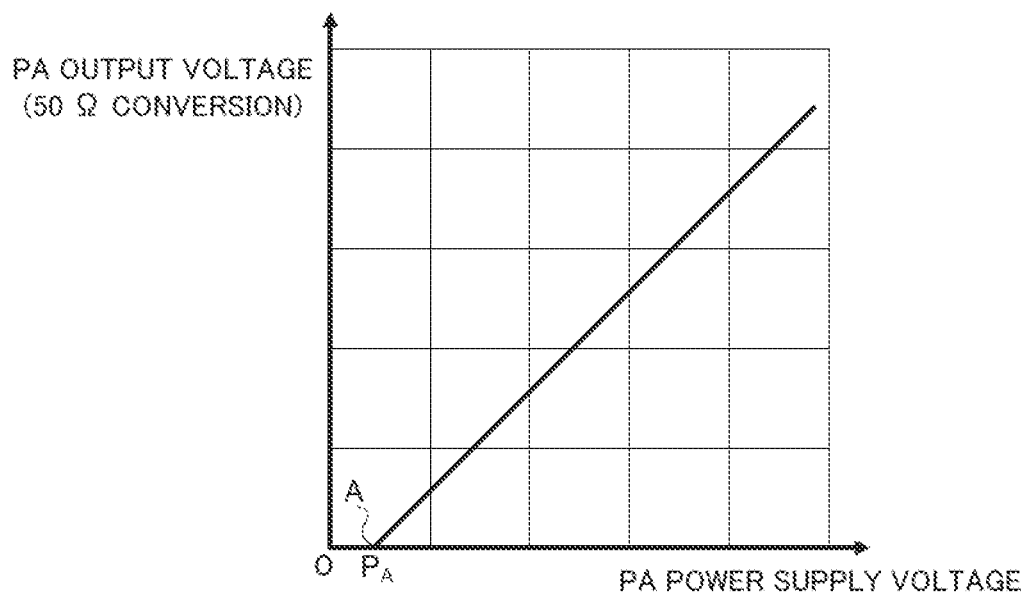
FIG. 17 shows an AM-AM characteristic when an amplification section is formed by a power amplifier using an HBT.

Next, the amplification section offset voltage will be explained using FIG. 17. FIG. 17 shows a relationship between power supply voltage of a power amplifier and output voltage of a power amplifier, when amplification section 140 is formed by a power amplifier using an HBT. In FIG. 17, the x-axis shows the power supply voltage (that is proportional to the output voltage from amplitude control section 410 of FIG. 16) of a power amplifier, and the y-axis shows the voltage converted the output power of a power amplifier as the voltage applying to resistance of 50 Ω. This characteristic showing the relationship between the power supply voltage and output voltage of the power amplifier is generally referred to as an amplitude modulation to amplitude modulation (AM-AM) characteristic, and the power amplifier where an AM-AM characteristic varies linearly is preferable for a polar modulation transmission circuit.

Although the AM-AM characteristic shown in FIG. 17 varies linearly, the line crosses with the x-axis at A point and does not pass the origin, so that the power supply voltage and output voltage of the power amplifier does not bear a proportionate relationship. Therefore, if an amplitude signal of a voltage value that is smaller than voltage $P_A$ at A point, no signal will be output from a power amplifier. In FIG. 17, voltage $P_A$ at A point is proportional to the above amplification section offset voltage. If there is an amplification section offset voltage, the AM-AM characteristic does not bear a proportionate relationship, so that distortion is generated due to the amplification section offset voltage.

Therefore, when amplification section 140 is formed by a power amplifier using HBT having an AM-AM characteristic shown in FIG. 17, it is necessary to apply voltage $P_A$, that is proportional to an amplification section offset voltage, to an amplitude signal as the offset voltage, shifts an amplitude signal over voltage $P_A$, and then inputs as the power supply voltage of amplification section 140.

The amplification section offset voltage varies, for example, by variability of production and temperature. Therefore, it is preferable to be able to adjust the amplification section offset voltage appropriately. With the present embodiment, offset calculation section 411 adjusts this amplification section offset voltage, and applies the adjusted amplification section offset voltage to a differential amplitude signal output from offset calculation section 123. The amplification section offset voltage will be explained below using FIG. 18 and FIG. 19.

Figure 18:
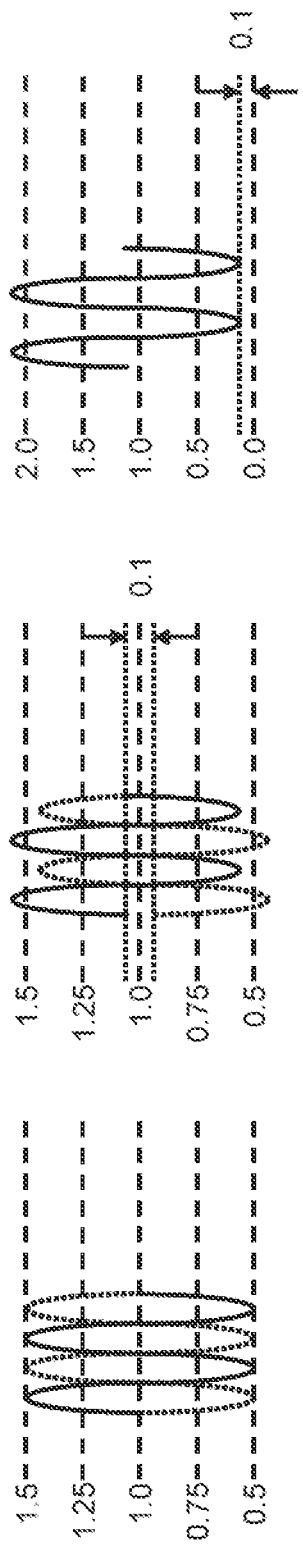
FIG. 18 shows the output waveforms of an offset calculation section, an offset calculation section, and a differential single conversion section, when a differential amplitude signal is defined as a sine wave, the gain of a level control section is maximum, and an amplification section offset voltage is 0.1 V.

FIG. 18 shows the output waveform of offset calculation section 123 (FIG. 18A), the output waveform of offset calculation section 411 (FIG. 18B), and the output waveform of differential single conversion section 124 (FIG. 18C), when assuming a differential amplitude signal as a sine wave, the gain of level control section 122 is maximum, and the amplification section offset voltage is 0.1 V.

Figure 19:
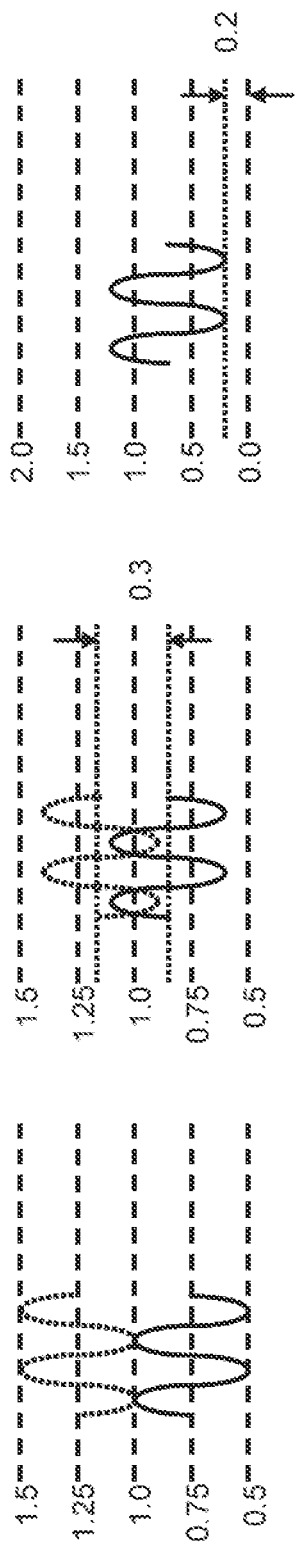
FIG. 19 shows the output waveforms of an offset calculation section, an offset calculation section, and a differential single conversion section, when a differential amplitude signal is defined as a sine wave, the gain of a level control section is half of the maximum gain, and an amplification section offset voltage is 0.2 V.

Also, FIG. 19 shows the output waveform of offset calculation section 123 (FIG. 19A), the output waveform of offset calculation section 411 (FIG. 19B), and the output waveform of differential single conversion section 124 (FIG. 19C), when assuming a differential amplitude signal as a sine wave, the gain of level control section 122 is half of the maximum gain, and the amplification section offset voltage is 0.2 V.

As FIG. 4 and so on, FIG. 18 and FIG. 19 show the output waveforms of when the gain of level control section 122 is maximum, the one-side amplitude of a differential amplitude signal output from level control section 122 is 1 Vpp, and the gain of differential single conversion section 124 is x1, the predetermined DC voltage (V3) to add is 1 V.

FIG. 18 is an example of when the gain of level control section 122 is maximum, and, since a differential amplitude signal where a one-side amplitude from level control section 122 is 1 Vpp, the maximum output amplitude of differential single conversion section 124 is 2 Vpp. In this case, V=Vmax holds, so that the DC voltage is 0 by equation 2. Therefore, first offset calculation section 123 outputs a differential amplitude signal to second offset calculation section 411 as is (see FIG. 18A). Second offset calculation section 411 applies amplification section offset voltage of 0.1 V to a differential amplitude signal. Amplification section offset voltage of 0.1 V matches offset information Q. As shown in FIG. 18B, the DC voltage (amplification section offset voltage) to match offset information Q is applied to a differential amplitude signal with an additive polarity. A differential amplitude signal where amplification section offset voltage of 0.1 V is applied is converted into a single-end signal by differential single conversion section 124. As shown in FIG. 18C, a single-end signal input to amplification section 140 is offset over the amount of the amplification section offset voltage. As a result, it is possible to prevent generation of amplifying distortion.

FIG. 19 is an example when the gain of level control section 122 is half of the maximum gain, and a differential amplitude signal where a one-side amplitude is 1 Vpp is output from level control section 122, so that the maximum output amplitude of differential single conversion section 124 is 1 Vpp. When the gain of level control section 122 is half of the maximum gain, V=Vmax/2 holds, so that the DC voltage is 0.5 V by equation 2. Therefore, first offset calculation section 123 applies amplification section offset voltage of 0.5 V to a differential amplitude signal and outputs the applied differential amplitude signal to second offset calculation section 411 (see FIG. 19A). As shown in FIG. 19B, the DC voltage (amplification section offset voltage) to match offset information Q is applied to a differential amplitude signal with an additive polarity. A differential amplitude signal where amplification section offset voltage of 0.2 V is applied is converted into a single-end signal by differential single conversion section 124. As shown in FIG. 19C, a single-end signal input to amplification section 140 is offset over the amplification section offset voltage. As a result, it is possible to prevent generation of amplifying distortion.

As explained above, according to the present embodiment, in addition to the effect of embodiment 1, since second offset calculation section 411 that applies the amplification section offset voltage of amplification section 140 to a differential amplitude signal output from first offset calculation section 123 is provided, it is possible to achieve the following result in addition to the result of embodiment 1. Therefore, even when the offset voltage that is inherent to amplification section 140 varies, it is possible to compensate the offset voltage in advance by adjusting the offset voltage of amplification section 140, and acquire the effect to prevent distortion generated due to the offset voltage.

(Embodiment 4)

Figure 20:
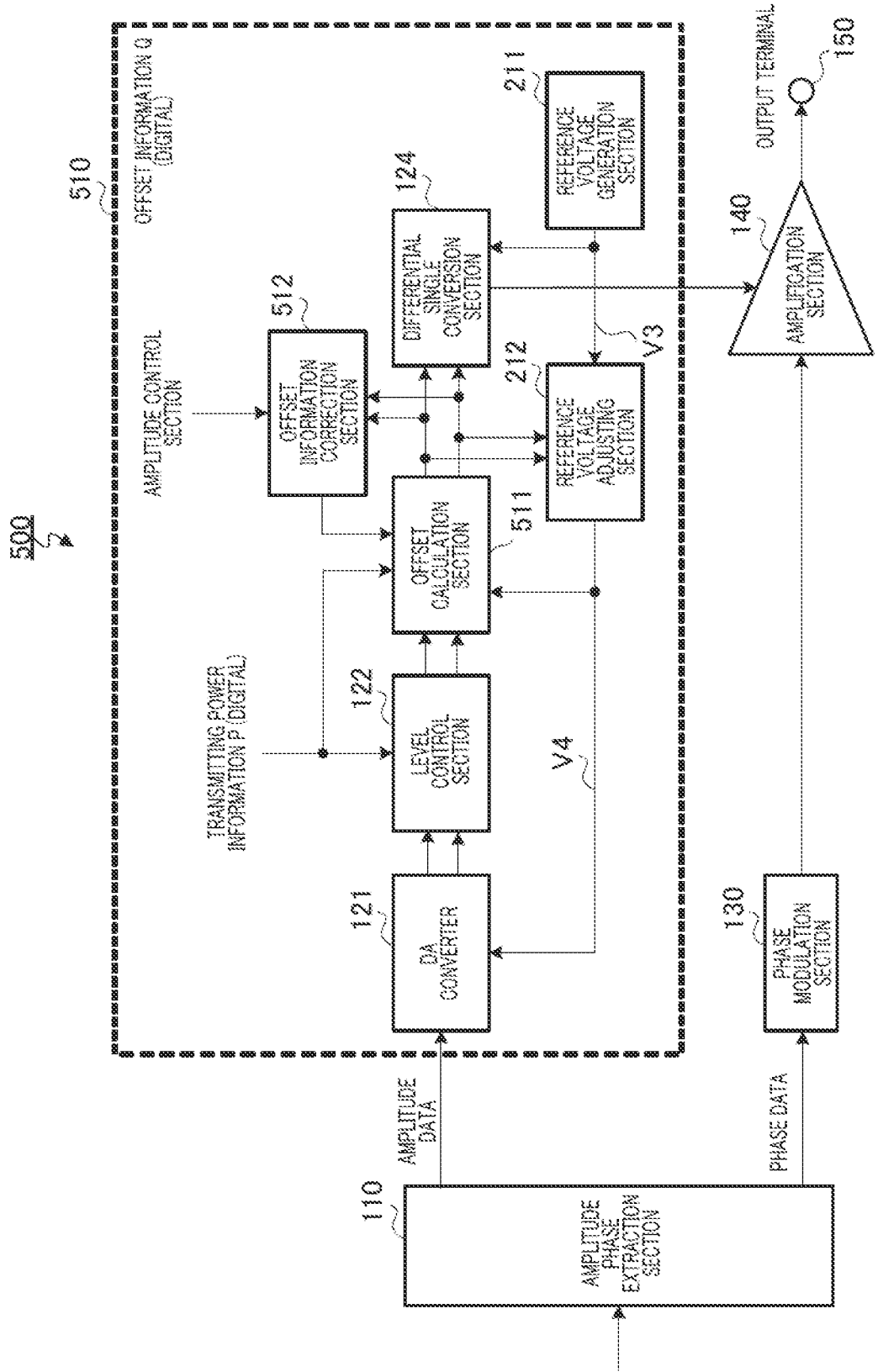
FIG. 20 is a block diagram showing a configuration example of a polar modulation transmission circuit of embodiment 4.

FIG. 20, where parts that are the same as in FIG. 16 are assigned the same reference numerals as in FIG. 16, shows a configuration example of a polar modulation transmission circuit according to the present embodiment. Polar modulation transmission circuit 500 of the present embodiment has amplitude control section 510. Amplitude control section 510 essentially has the same function as amplitude control section 410 of embodiment 3. However, amplitude control section 510 of the present embodiment employs a configuration where offset calculation section 511 collectively performs the processing that is performed by first offset calculation section 123 and second offset calculation section 411 included in amplitude control section 410 of embodiment 3. Furthermore, this amplitude control section 510 has offset information correction section 512.

Reference voltage adjusting section 212 calculates the gain from DA converter 121 to offset calculation section 511 by detecting the output of offset calculation section 511. In this case, it is preferable for offset information Q to input information indicating that the amplification section output voltage is proportional to zero. By providing as above, the amplification section offset voltage is not included in the output of offset calculation section 511, so that it is possible to apply the same correction method as embodiment 1. Also, in order to make the value of the gain to be the defined value, reference voltage V3 output from reference voltage generation section 211 is adjusted, and the adjusted reference voltage V4 is supplied to DA converter 121 and offset calculation section 511.

Offset calculation section 511 receives as input transmitting power information P that shows the size of the average output power of a transmission signal of polar modulation transmission circuit 500 and the offset information corrected by offset information correction section 512, and is controlled by pieces of information. Offset information correction section 512 corrects offset information Q showing the size of offset (amplification section offset voltage) that is inherent to amplification section 140 by using the ratio between reference voltage V3 output from reference voltage generation section 211 and reference voltage V4 output from reference voltage adjusting section 212, and, by this means, acquires the correction offset information (corrected offset information), and outputs this correction offset information to offset calculation section 511. By this means, in amplitude control section 510, the amplification section offset voltage is not changed by the adjustment of the reference voltage. For example, when reference voltage V4 is 1.2 times of reference voltage V3, amplitude control section 510 corrects offset information Q as the digital value that is proportional to the value of 1/1.2 times. By contraries, when reference voltage V4 is 1/1.2 times of reference voltage V3 as described in embodiment 1, amplitude control section 510 corrects offset information Q as the digital value that is proportional to the value of 1.2 times. Although offset information correction section 512 of FIG. 20 detects the output of offset calculation section 511, and calculates the correction offset information by using this output, it is equally possible to calculate the correction offset information by using reference voltages V3 and V4. When calculating the correction offset information by using reference voltages V3 and V4, it is enough to configure reference voltages V3 and V4 to input to offset information correction section 512.

Specifically, from transmitting power information P and 2 0 correction offset information, offset calculation section 511 calculates the total voltage of the DC voltage to match transmitting power information P, and the DC voltage to match the corrected offset information. Also, offset calculation section 511 applies the calculated total voltage to a differential amplitude signal output from level control section 122. FIG. 18 will be referred again to explain below.

FIG. 18 shows a case where the gain of level control section 122 is maximum. Thus, the DC voltage to match transmitting power information P is zero (see FIG. 18A). Meanwhile, since the amplification section offset is 0.1 V, the DC voltage to match offset information Q is 0.1 V and is applied to a differential amplitude signal with an additive polarity (see FIG. 18B). Thus, the size of total DC voltage is 0.1 V (|−0+0.1|V), and is applied to a differential amplitude signal with an additive polarity (see FIG. 18C).

FIG. 19 shows a case when the gain of level control section 122 is half of the maximum gain Gmax. Thus, the DC voltage to match transmitting power information P is 0.5 V, and is applied to a differential amplitude signal with a subtractive polarity (see FIG. 19A). Meanwhile, since the amplification section offset is 0.2 V, the DC voltage to match offset information Q is 0.2 V, and is applied to a differential amplitude signal with an additive polarity (see FIG. 19B). Thus, the size of total DC voltage is 0.3 V (|−0.5+0.2|V), and is applied to a differential amplitude signal with a subtractive polarity (see FIG. 19C).

Thus, compared to embodiment 3 where offset calculation section 123 to match transmitting power information P and offset calculation section 411 to match offset information Q are separately configured, as shown in FIG. 20, the present embodiment can make the total voltage of the DC voltage to match transmitting power information P and the DC voltage to match offset information Q configure only in offset calculation section 511, by calculating them in advance from transmitting power information P and correction offset information.

As described earlier, transmitting power information P and offset information Q are often expressed by a digital signal. Therefore, compared to the performance of offset calculation at two parts as embodiment 3, as the present embodiment, the calculation of the DC voltage to apply at offset calculation section 511, from transmitting power information P and offset information Q, can enhance the output accuracy in addition to reduction of the circuit scale.

As above, according to the present embodiment, in addition to the configuration of embodiment 1, offset calculation section 511, that applies to a differential amplitude signal as the DC offset the voltage, that reflects the DC voltage that is proportional to the offset voltage of amplification section 140, to the DC voltage that is proportional to the difference between the output amplitude of level control section 122 when the gain of level control section 122 is maximum and the output amplitude of level control section 122 level-controlled according to the transmitting power information, is provided. By this way, compared to embodiment 3, it is possible to reduce a circuit scale and enhance output accuracy.

Offset voltage calculation sections 411 and 511 explained in embodiments 3 and 4 can be added to amplitude amplification section 310 explained in embodiment 2.

The above description is a suitable example of embodiments of the present invention, and the range of the present invention is not limited to this. It is possible to implement by other various embodiments without departing from the substance.

The disclosure of Japanese Patent Application No.2009-140546, filed on Jun. 11, 2009, including the specification, drawings and abstract, is incorporated herein by reference in its entirety.

INDUSTRIAL APPLICABILITY

An amplitude control circuit, polar modulation transmission circuit, and polar modulation method according to the present invention can decrease output noise, reduce receiving sensitivity, and is useful for, for example, a communication apparatus, such as a mobile telephone and a wireless LAN.

REFERENCE SIGNS LIST 10, 100, 200, 300, 400, 500 Polar modulation transmission circuit
11, 110 Amplitude phase extraction section
120, 210, 310, 410, 510 Amplitude control section
121 DA converter
122 Level control section 123, 311, 411, 511 Offset calculation section
124 Differential single conversion section
130 Phase modulation section
140 Amplification section
150 Output terminal
211 Reference voltage generation section
212 Reference voltage adjusting section
512 Offset information correction section

The invention claimed is:

1. An amplitude control circuit that is used for a polar modulation transmission circuit, the amplitude control circuit comprising:
a digital-to-analog converter that converts amplitude data into a differential amplitude signal and outputs a result;
a level control section that controls level of the differential amplitude signal output from the digital-to-analog converter, according to transmitting power information that shows output power of the polar modulation transmission circuit;
a first offset calculation section that applies a direct current offset to match the transmitting power information to the differential amplitude signal output from the level control section;
a differential single conversion section that performs differential single conversion to a differential amplitude signal output from the first offset calculation section and outputs a result;
a reference voltage generation section that supplies a reference voltage to the differential single conversion section; and
a reference voltage adjusting section that calculates gain from the digital-to-analog converter to the first offset calculation section, by detecting output of the first offset calculation section, adjusts the reference voltage from the reference voltage generation section in order to make a value of the gain to be a defined value, and supplies a result to the digital-to-analog converter and the first offset calculation section.

2. The amplitude control circuit according to claim 1, wherein the reference voltage adjusting section supplies a same reference voltage to the digital-to-analog converter and the offset calculation section.

3. The amplitude control circuit according to claim 1, wherein the first offset calculation section applies as the direct current offset a direct current voltage that is proportional to difference between output amplitude of the level control section of when the gain of the level control section is maximum, and the output amplitude of the level control section that is level-controlled according to the transmitting power information, to the differential amplitude signal that is level-controlled by the level control section.

4. The amplitude control circuit according to claim 1, further comprising a second offset calculation section that calculates a correction offset voltage based on the output of the first offset calculation section and the power information, and adds the correction offset voltage to the first offset calculation section.

5. The amplitude control circuit according to claim 1, further comprising a second offset calculation section that calculates a correction offset voltage based on the output of the first offset calculation section and the power information, and adds the correction offset voltage to the differential single conversion section.

6. A polar modulation transmission circuit that generates and outputs a transmission signal based on input data, the circuit comprising:
an amplitude phase extraction section that extracts amplitude data and phase data from the input data;
a phase modulation section that performs phase modulation by using the phase data and outputs a phase modulation signal;
an amplification section that amplifies the phase modulation signal based on a control voltage and outputs a result as the transmission signal; and
an amplitude control section that forms the control voltage according to the amplitude data and supplies the amplification section, wherein the amplitude control section comprises:
a digital-to-analog converter that converts the amplitude data into a differential amplitude signal and outputs a result;
a level control section that controls a level of the differential amplitude signal output from the digital-to-analog converter according to transmitting power information that shows output power of the polar modulation transmission circuit;
a first offset calculation section that applies a direct current offset to match the transmitting power information to the differential amplitude signal output from the level control section;
a differential single conversion section that acquires a single-end signal by performing differential single conversion to the differential amplitude signal output from the first offset calculation section, and supplies the single-end signal as the control voltage to the amplification section;
a reference voltage generation section that supplies a reference voltage to the differential single conversion section; and
a reference voltage adjusting section that calculates gain from the digital-to-analog converter to the first offset calculation section, by detecting output of the first offset calculation section, adjusts the reference voltage from the reference voltage generation section in order to make a value of the gain to be a defined value, and supplies a result to the digital-to-analog converter and the first offset calculation section.

7. The polar modulation transmission circuit according to claim 6, wherein the reference voltage adjusting section supplies a same reference voltage to the digital-to-analog converter and the offset calculation section.

8. The polar modulation transmission circuit according to claim 6, wherein the first offset calculation section applies as the direct current offset a direct current voltage that is proportional to difference between output amplitude of the level control section of when the gain of the level control section is maximum, and output amplitude of the level control section that is level-controlled according to the transmitting power information, to the differential amplitude signal that is level-controlled by the level control section.

9. The polar modulation transmission circuit according to claim 6, further comprising a second offset calculation section that calculates a correction offset voltage based on the output of the first offset calculation section and the power information, and adds the correction offset voltage to the first offset calculation section.

10. The polar modulation transmission circuit according to claim 6, further comprising a second offset calculation section that calculates a correction offset voltage based on the output of the first offset calculation section and the power information, and adds the correction offset voltage to the differential single conversion section.

11. A polar modulation method that comprises:
- an amplitude phase extraction step of extracting amplitude data and phase data from input data;
- a phase modulation step of performing phase modulation using the phase data and outputting a phase modulation signal;
- an amplification step of amplifying the phase modulation signal based on a control voltage and outputting a transmission signal; and
- an amplitude control step of forming the control voltage according to the amplitude data and supplying to an amplification section, wherein the amplitude control step comprises:
- a conversion step of converting the amplitude data into a differential amplitude signal;
- a level control step of controlling level of the differential amplitude signal according to transmitting power information;
- a first offset calculation step of applying a direct current offset to match the transmitting power information to the level controlled differential amplitude signal;
- a differential single conversion step of forming a single-end signal using as the control voltage at the amplifier step by performing differential single conversion to the differential amplitude signal where the direct current offset is applied;
- a reference voltage step of generating a reference voltage to use when performing the differential single conversion step; and
- a reference voltage adjusting step of calculating gain from a digital-to-analog conversion step to the first offset calculation step by detecting the differential amplitude signal where the direct current offset is applied, adjusting the reference voltage acquired at the reference voltage step to make a value of the gain to be a defined value, and forming the reference voltage to use at the digital-to-analog conversion step and the first offset calculation step.

12. The polar modulation method according to claim 11, wherein the amplitude control step further comprises a second offset calculation step of calculating a correction offset voltage based on the differential amplitude signal acquired in the first offset calculation step and the power information, and adding the correction offset voltage to the differential amplitude signal acquired in the first offset calculation step.

13. The polar modulation method according to claim 11, wherein the amplitude control step further comprises a second offset calculation step of calculating a correction offset voltage based on the differential amplitude signal acquired in the first offset calculation step and the power information, and adding the correction offset voltage to a differential single signal acquired in the differential single conversion step.

* * * * *